United States Patent
Wang et al.

(10) Patent No.: US 11,798,849 B2
(45) Date of Patent: Oct. 24, 2023

(54) SEMICONDUCTOR DEVICE WITH FIN END SPACER PLUG AND METHOD OF MANUFACTURING THE SAME

(71) Applicant: TAIWAN SEMICONDUCTOR MANUFACTURING COMPANY, LTD., Hsinchu (TW)

(72) Inventors: Tzu-Chung Wang, Hsinchu (TW); Tung Ying Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/591,906

(22) Filed: Feb. 3, 2022

(65) Prior Publication Data

US 2022/0157665 A1    May 19, 2022

Related U.S. Application Data

(62) Division of application No. 16/535,975, filed on Aug. 8, 2019, now Pat. No. 11,244,867.

(60) Provisional application No. 62/738,347, filed on Sep. 28, 2018.

(51) Int. Cl.
  *H01L 21/8234* (2006.01)
  *H01L 29/66* (2006.01)
  *H01L 29/78* (2006.01)
  *H01L 27/088* (2006.01)

(52) U.S. Cl.
  CPC ........ *H01L 21/823468* (2013.01); *H01L 21/823418* (2013.01); *H01L 21/823431* (2013.01); *H01L 21/823481* (2013.01); *H01L 27/0886* (2013.01); *H01L 29/6681* (2013.01); *H01L 29/785* (2013.01)

(58) Field of Classification Search
  None
  See application file for complete search history.

(56) References Cited

U.S. PATENT DOCUMENTS

| | | |
|---|---|---|
| 9,653,583 B1 | 5/2017 | Zhao |
| 2011/0316081 A1 | 12/2011 | Chan |
| 2018/0158824 A1 | 6/2018 | Kim |
| 2019/0088649 A1 | 3/2019 | Doornbos |
| 2019/0165146 A1 | 5/2019 | Ho |

OTHER PUBLICATIONS

Non-Final Office Action issued in U.S. Appl. No. 16/535,975, dated Dec. 15, 2020.
Non-Final Office Action issued in U.S. Appl. No. 16/535,975, dated May 14, 2021.
Notice of Allowance issued in U.S. Appl. No. 16/535,975, dated Sep. 30, 2021.

*Primary Examiner* — Alexander G Ghyka
(74) *Attorney, Agent, or Firm* — McDermott Will & Emery LLP

(57) ABSTRACT

A semiconductor device includes a plurality of fins on a substrate, a fin end spacer plug on an end surface of each of the plurality of fins and a fin liner layer, an insulating layer on the plurality of fins, and a source/drain epitaxial layer in a source/drain recess in each of the plurality of fins.

20 Claims, 16 Drawing Sheets

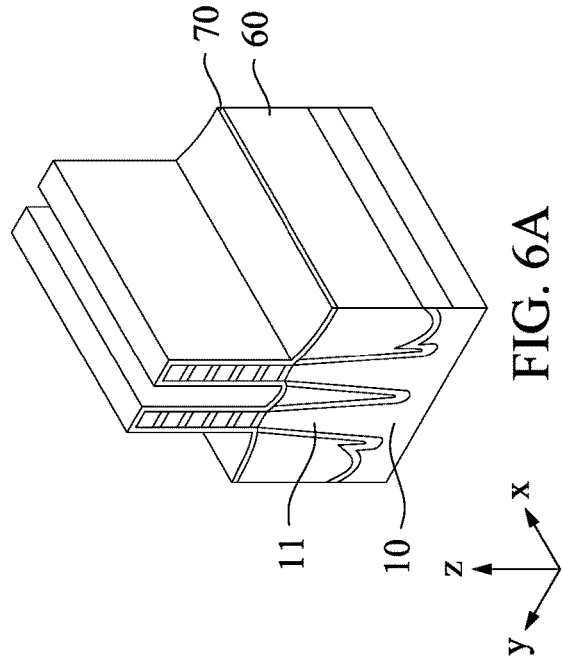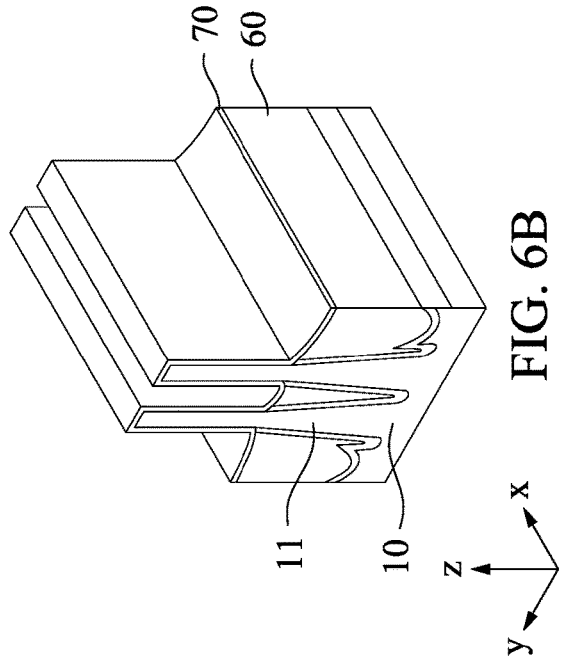
FIG. 5A  FIG. 6A
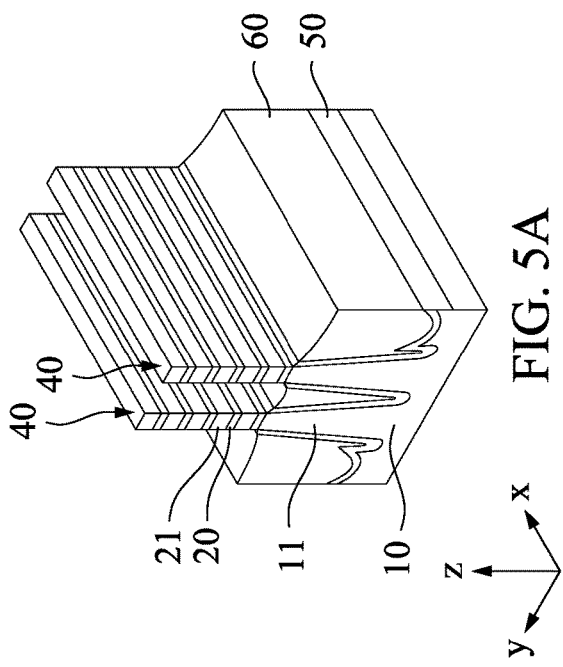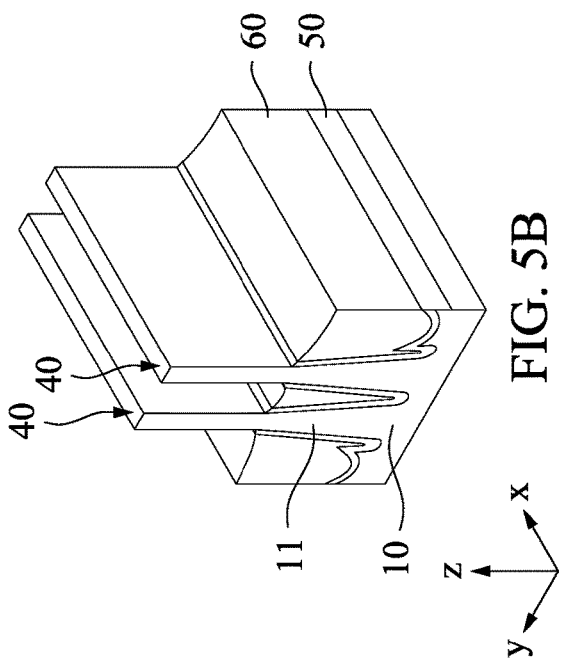
FIG. 5B  FIG. 6B

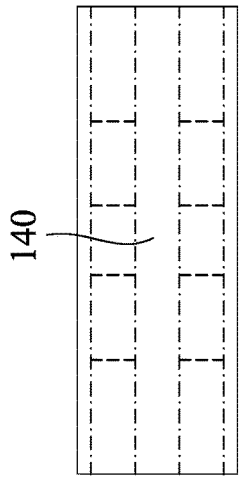
FIG. 9A
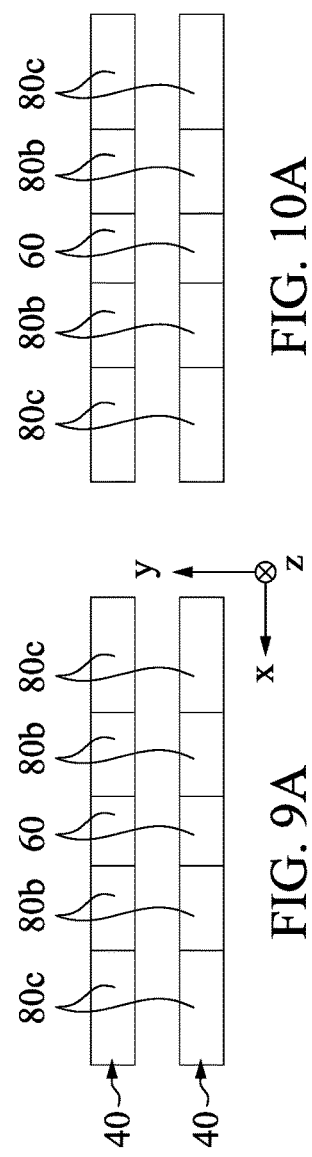
FIG. 9B
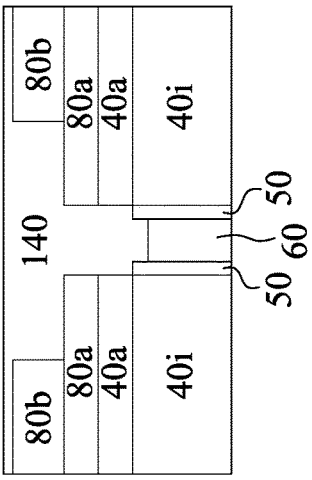
FIG. 10A
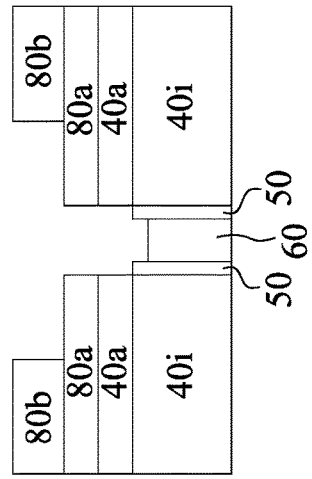
FIG. 10B
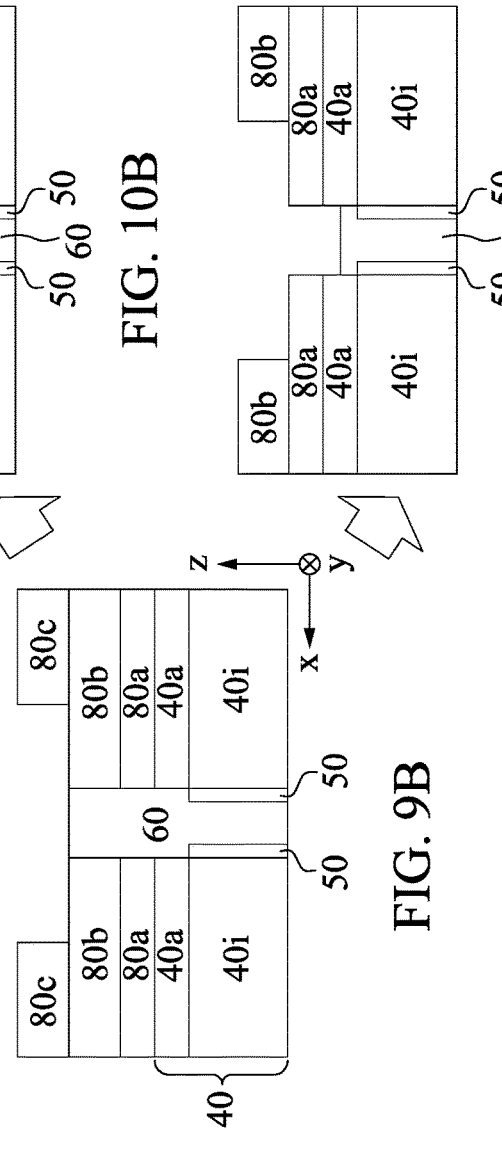
FIG. 10C
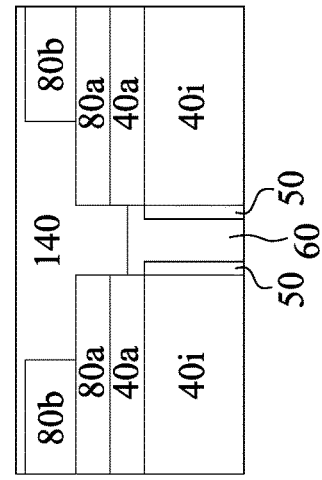
FIG. 11A
FIG. 11B
FIG. 11C

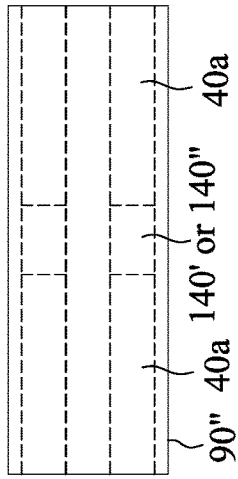
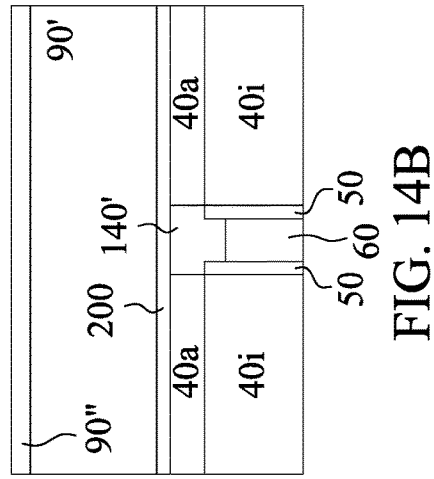
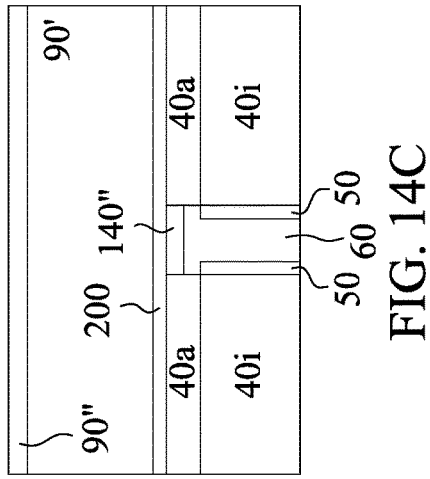
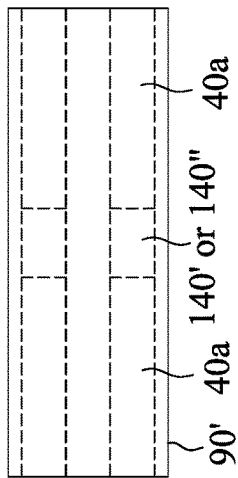
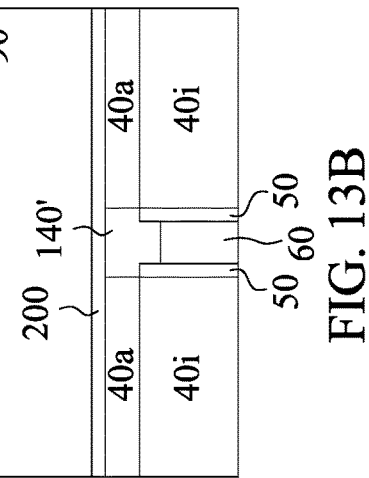
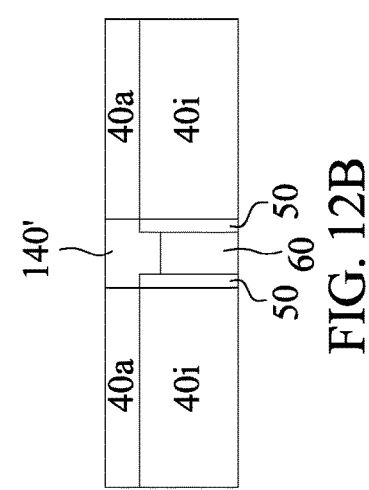
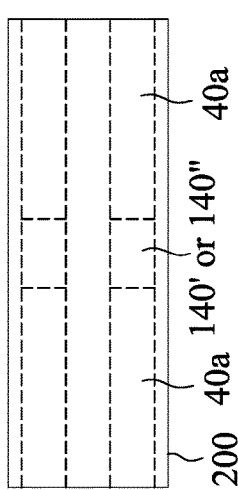
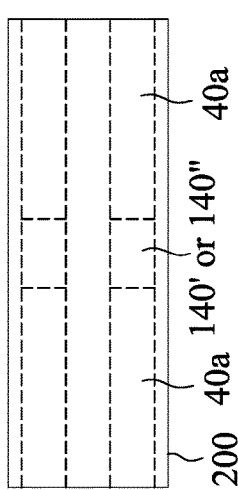
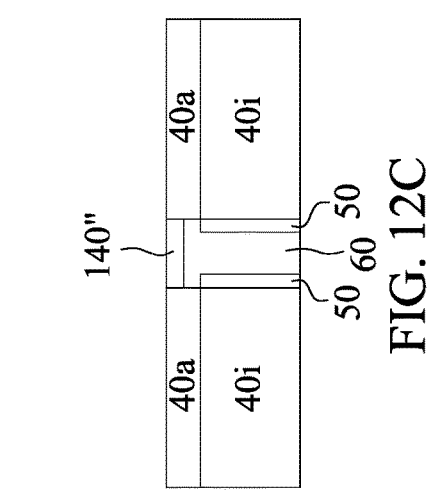

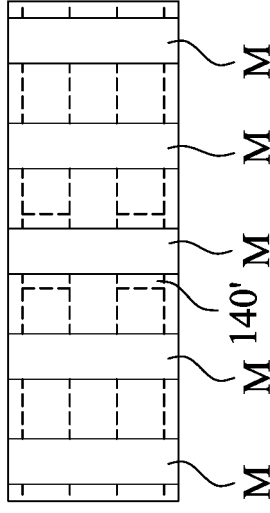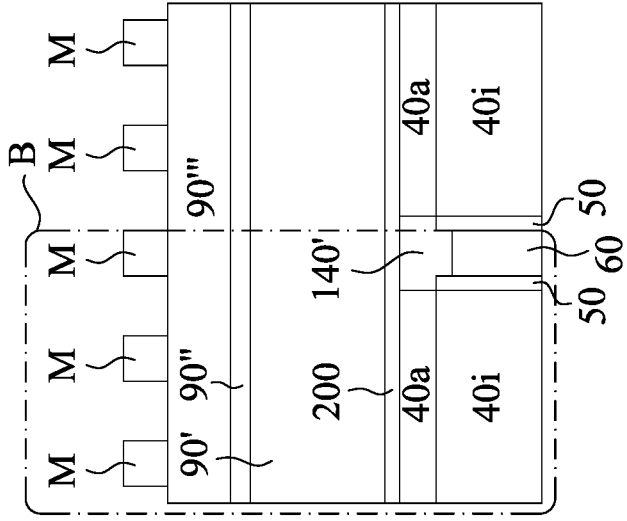
FIG. 15A
FIG. 15B
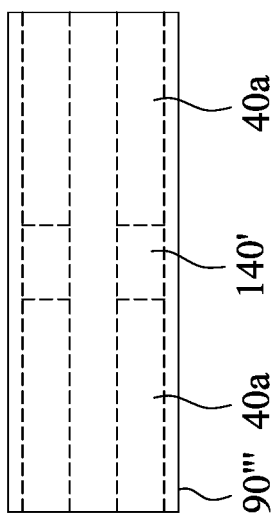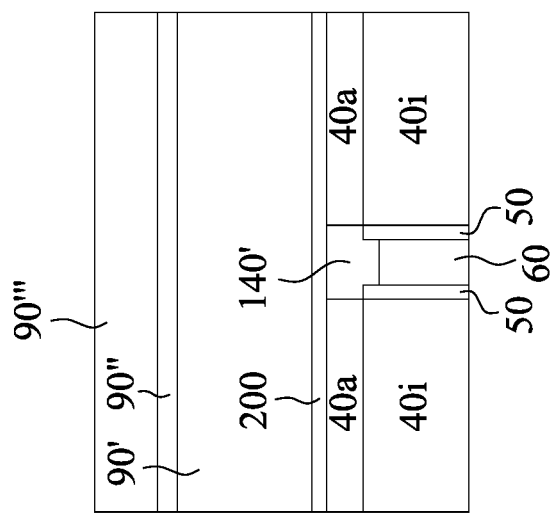
FIG. 16A
FIG. 16B

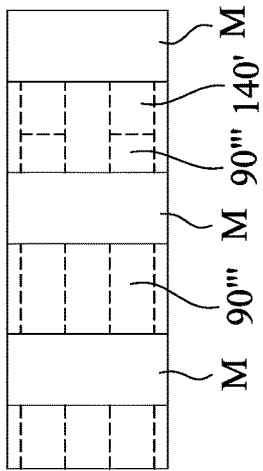
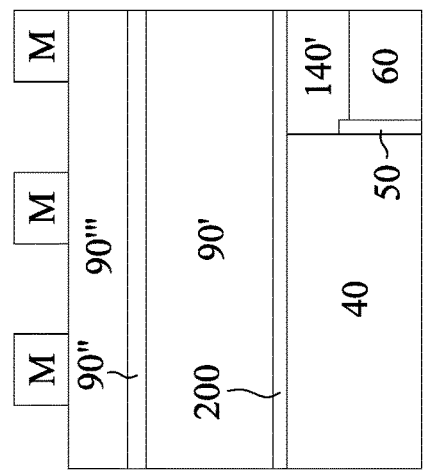
FIG. 17A
FIG. 17B
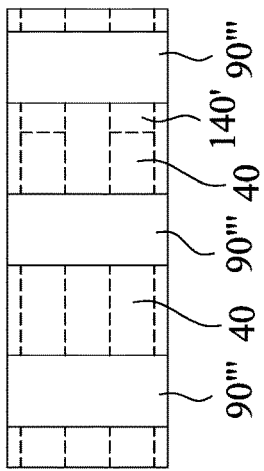
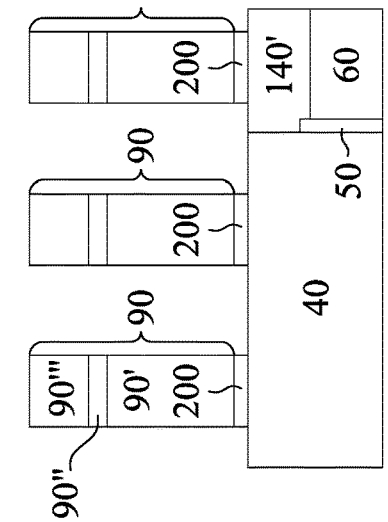
FIG. 18A
FIG. 18B
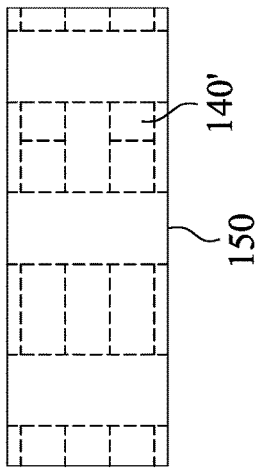
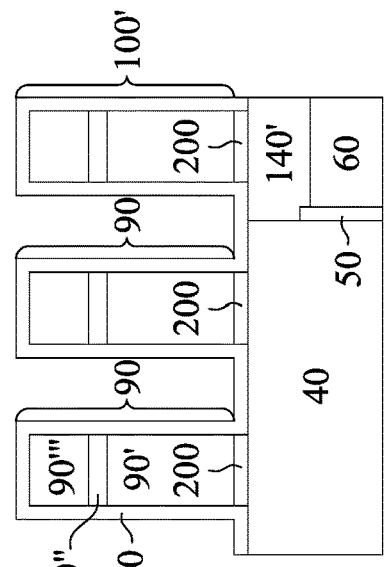
FIG. 19A
FIG. 19B

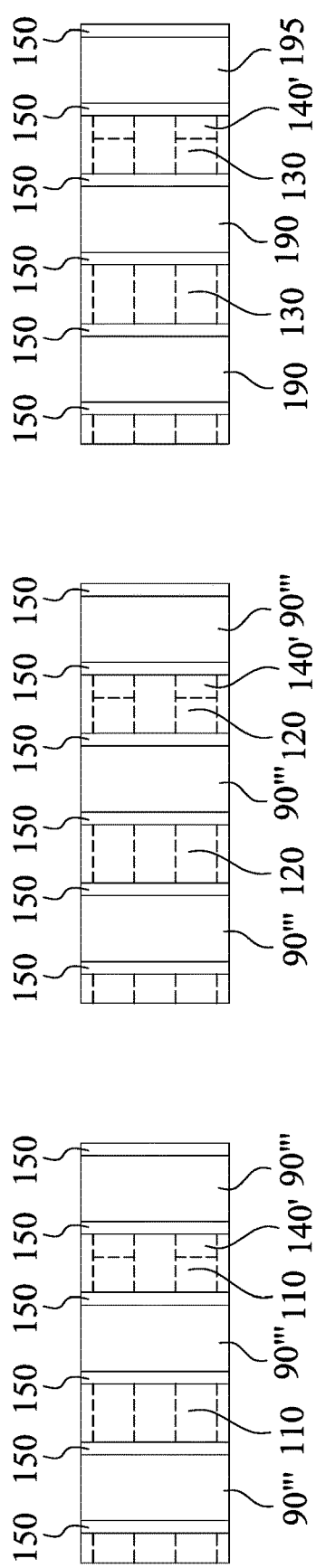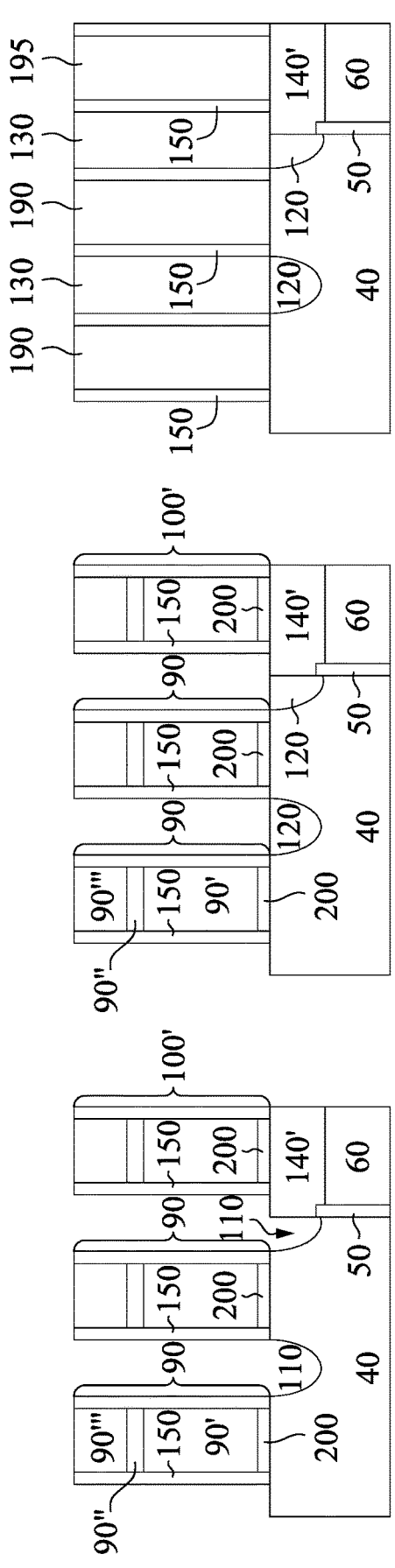

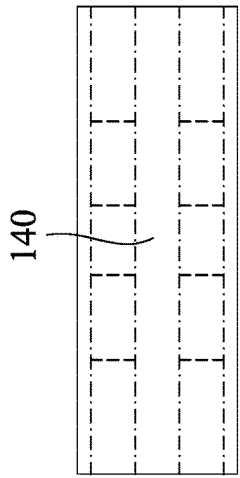
FIG. 25A
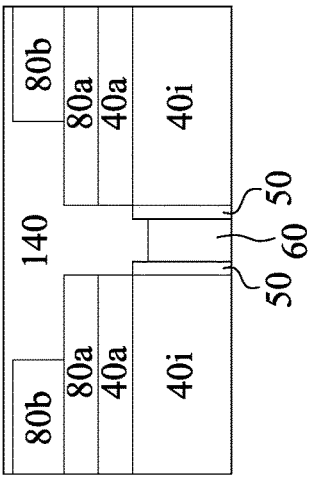
FIG. 26A
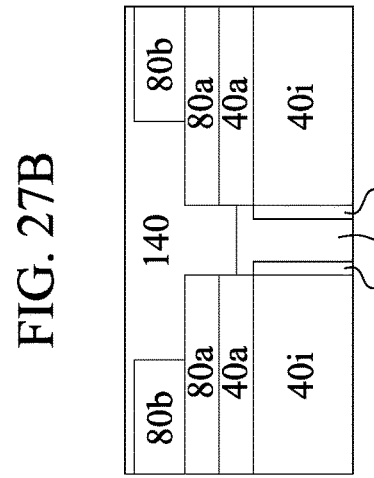
FIG. 27A
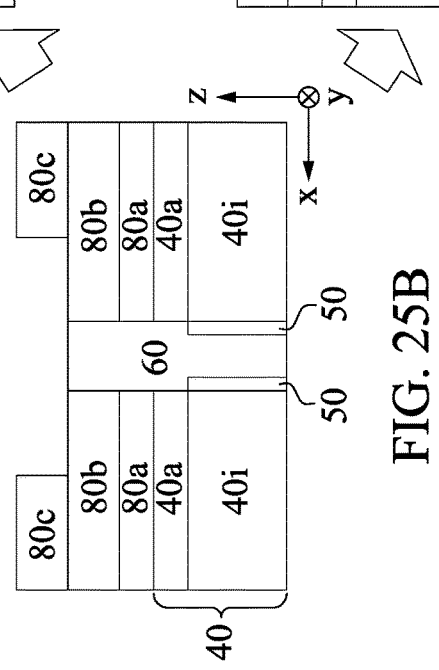
FIG. 25B
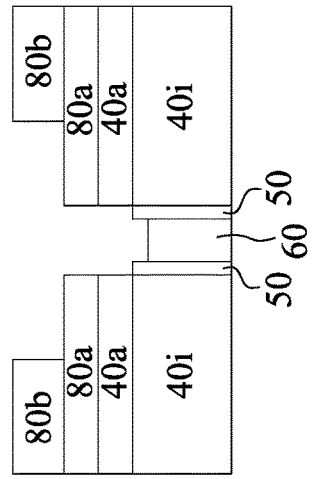
FIG. 26B
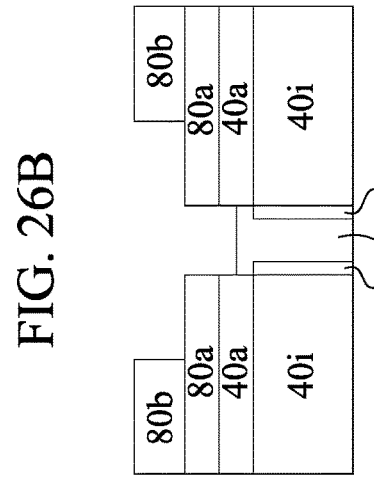
FIG. 27B
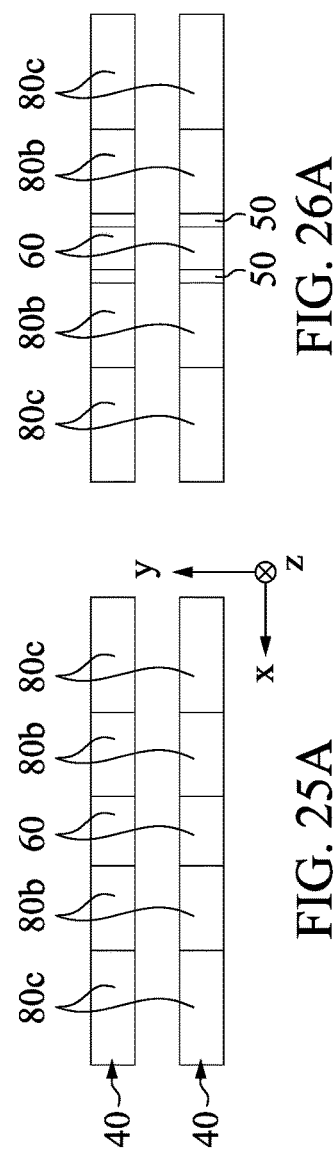
FIG. 26C
FIG. 27C

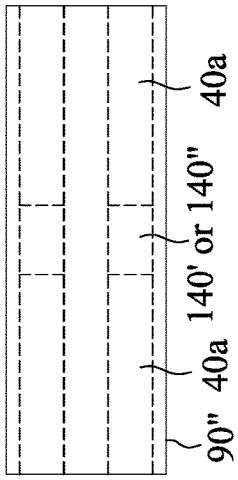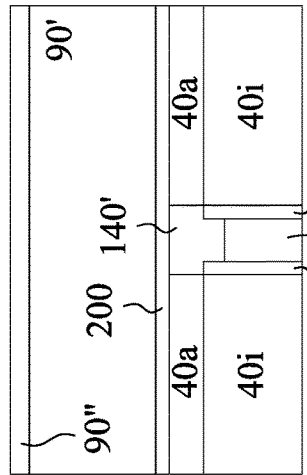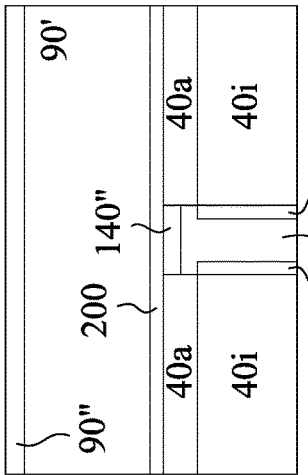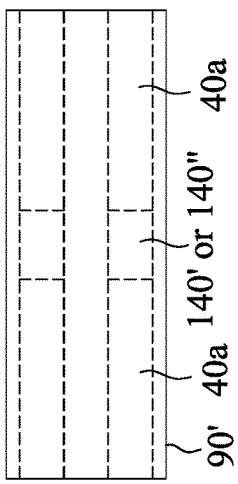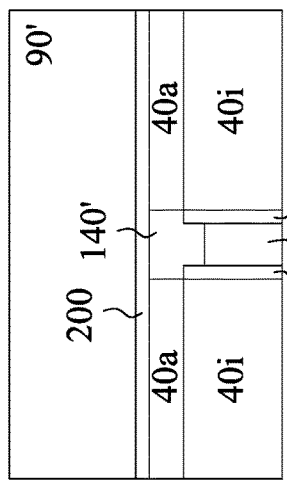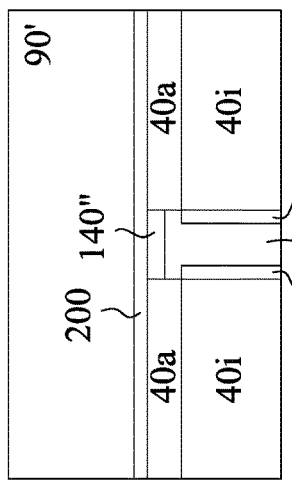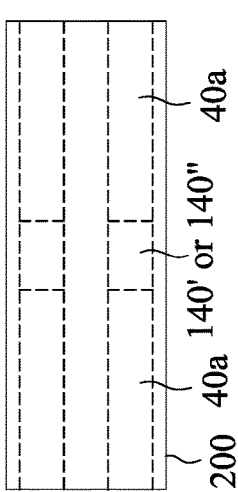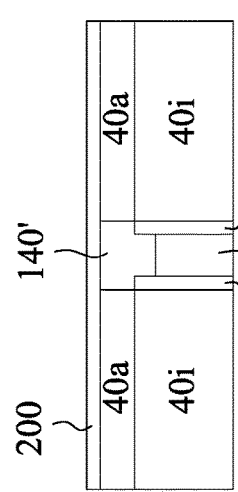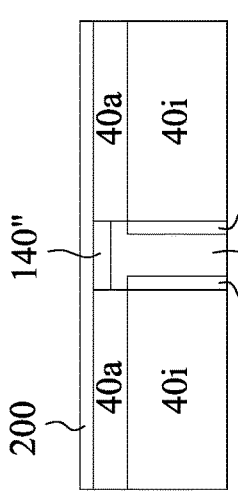

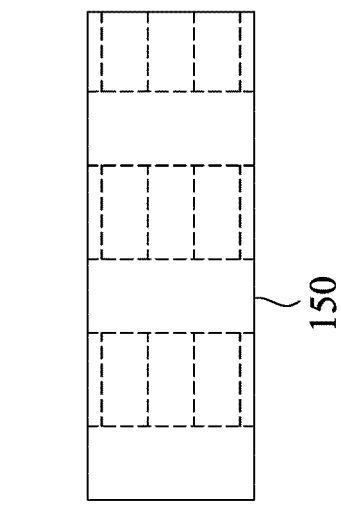
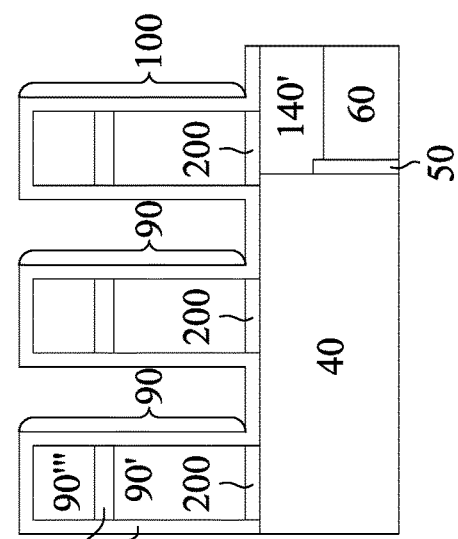
FIG. 33A
FIG. 33B
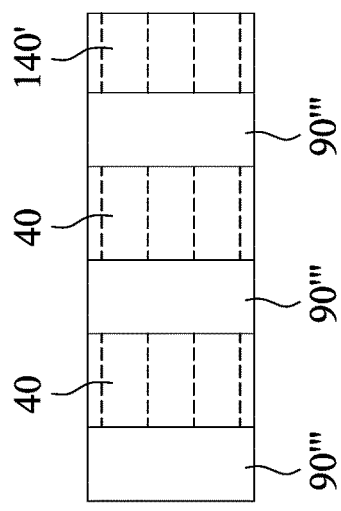
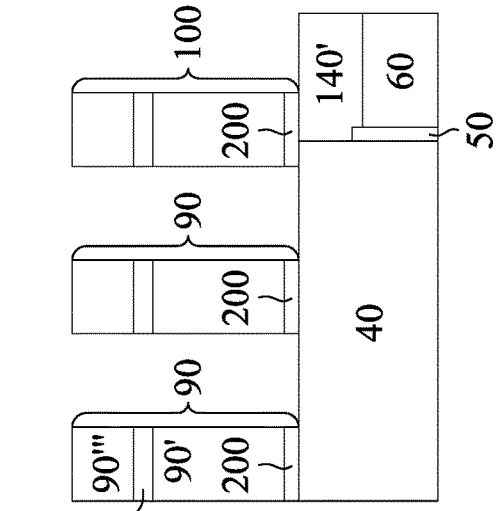
FIG. 34A
FIG. 34B
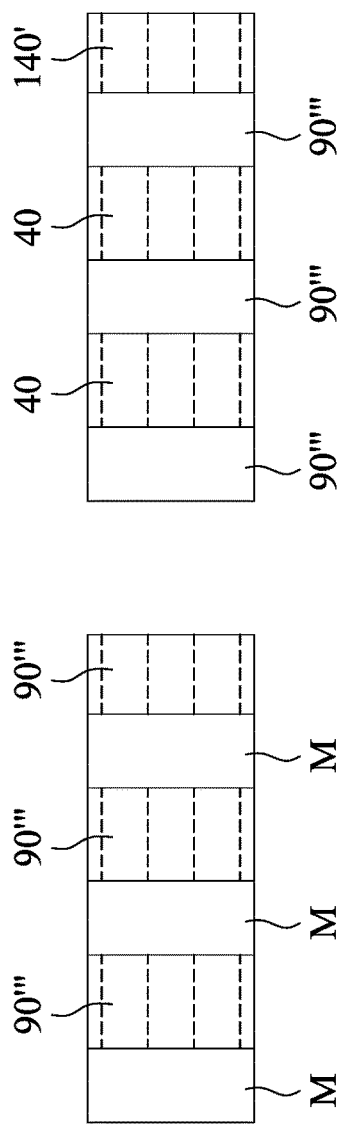
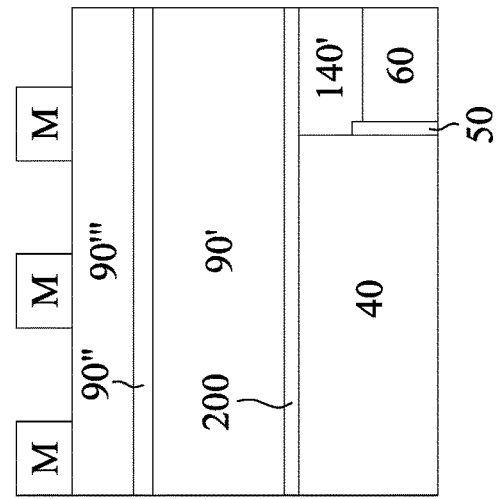
FIG. 35A
FIG. 35B

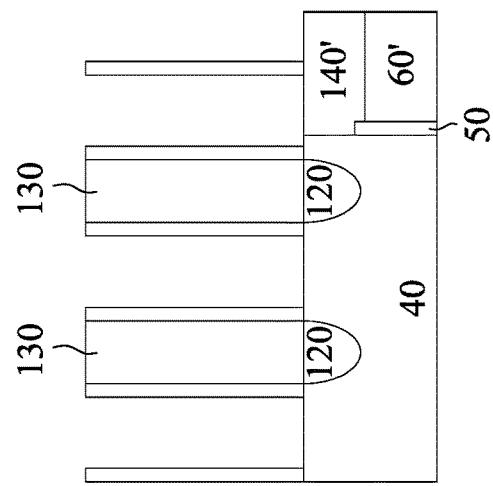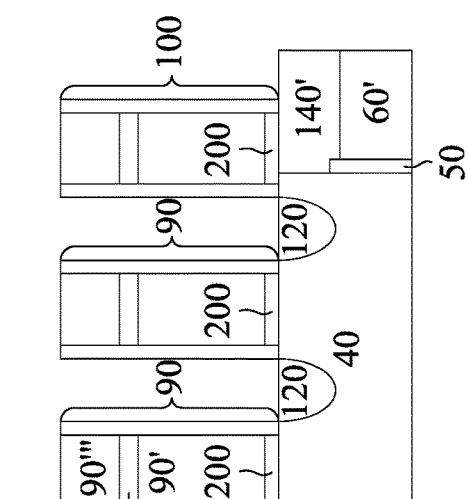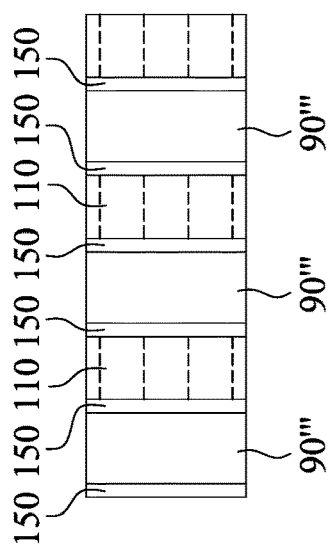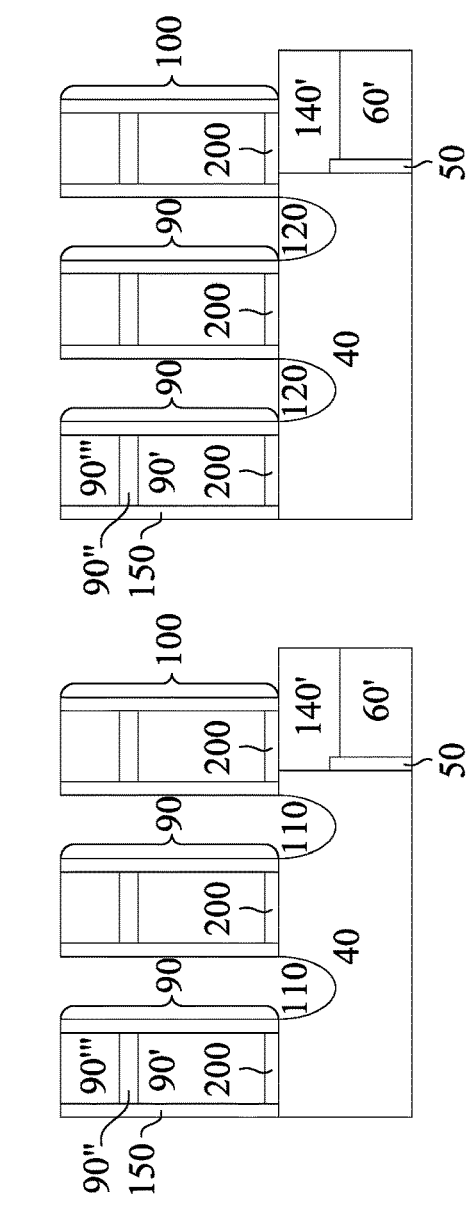

SEMICONDUCTOR DEVICE WITH FIN END SPACER PLUG AND METHOD OF MANUFACTURING THE SAME

RELATED APPLICATION

This application is a divisional of U.S. patent application Ser. No. 16/535,975 filed on Aug. 8, 2019, now U.S. Pat. No. 11,244,867, which claims priority to U.S. Provisional Patent Application No. 62/738,347 filed on Sep. 28, 2018, the entire contents of each of which are incorporated herein by reference.

TECHNICAL FIELD

The disclosure relates to methods of manufacturing fin field effect transistors (FinFETs) and/or gate-all-around (GAA) field effect transistors (FETs) for semiconductor integrated circuits, and more particularly to methods of manufacturing fin end spacer plugs to protect a source/drain epitaxial layer, and semiconductor devices.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin field effect transistor (FinFET) and a gate-all-around (GAA) field effect transistor (FET). In a FinFET, a gate electrode is adjacent to three side surfaces of a channel region with a gate dielectric layer interposed therebetween. Because the gate structure surrounds (wraps) the fin on three surfaces (i.e., the top surface and the opposite lateral surfaces), the transistor essentially has three gates controlling (one gate at each of the top surface and the opposite lateral surfaces) the current through the fin or channel region. The fourth side of the bottom of the channel is far away from the gate electrode and thus is not under close gate control. In contrast, in a GAA FET, all side surfaces (i.e. the top surface, the opposite lateral surfaces, and the bottom surface) of the channel region are surrounded by the gate electrode, which allows for fuller depletion in the channel region and results in reduced short-channel effect due to steeper sub-threshold current swing (SS) and smaller drain induced barrier lowering (DIBL). As transistor dimensions are continually scaled down to sub 10-15 nm technology nodes, further improvements of the FinFETs and/or GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5A shows a schematic view of the processed substrate of FIG. 4A, according to an embodiment of the present disclosure.

FIG. 5B shows a schematic view of the processed substrate of FIG. 4B, according to another embodiment of the present disclosure.

FIG. 6A shows a schematic view of the processed substrate of FIG. 5A, according to an embodiment of the present disclosure.

FIG. 6B shows a schematic view of the processed substrate of FIG. 5B, according to another embodiment of the present disclosure.

FIGS. 9A, 9B, 10A, 10B, 10C, 11A, 11B, 11C, 12A, 12B, 12C, 13A, 13B, 13C, 14A, 14B, 14C, 15A, 15B, 16A, 16B, 17A, 17B, 18A, 18B, 19A, 19B, 19C, 20A, 20B, 21A, 21B, 22A, and 22B show operations of manufacturing a semiconductor FinFET device according to an embodiment of the present disclosure. Each of FIGS. 9A, 10A, 11A, 12A, 13A, 14A, 15A, 16A, 17A, 18A, 19A, 20A, 21A, and 22A includes a top plan view and each of FIGS. 9B, 9C, 10B, 10C, 11B, 11C, 12B, 12C, 13B, 13C, 14B, 14C, 15B, 16B, 17B, 18B, 19B, 20B, 21B, and 22B includes a cross-sectional view of the semiconductor FinFET device along a cut line A-A in a plane including x and z axes of FIG. 7.

FIGS. 25A, 25B, 26A, 26B, 27A, 27B, 28A, 28B, 29A, 29B, 30A, 30B, 31A, 31B, 32A, 32B, 33A, 33B, 34A, 34B, 35A, 35B, 36A, 36B, 37A, 37B, 38A, and 38B show operations of manufacturing a semiconductor FinFET device according to an embodiment of the present disclosure. Each of FIGS. 25A, 26A, 27A, 28A, 29A, 30A, 31A, 32A, 33A, 34A, 35A, 36A, 37A, and 38A includes a top plan view and each of FIGS. 25B, 26B, 26C, 27B, 27C, 28B, 28C, 29B, 29C, 30B, 30C, 31B, 32B, 33B, 34B, 35B, 36B, 37B, and 38B includes a cross-sectional view of the semiconductor FinFET device along a cut line A-A in a plane including x and z axes of FIG. 23.

DETAILED DESCRIPTION

Figure 2:
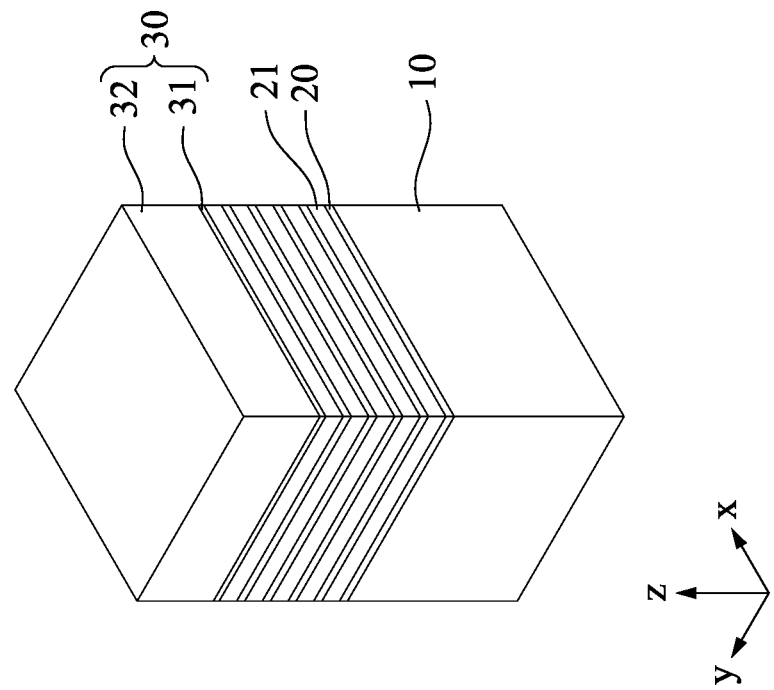
FIG. 2 shows a schematic view of stacked semiconductor layers formed over the processed substrate of FIG. 1, according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In this disclosure, a source/drain refers to a source and/or a drain. It is noted that in the present disclosure, a source and a drain are interchangeably used and the structures thereof are substantially the same.

During the manufacturing process of a semiconductor FET device having source/drain epitaxial layers, overlay shift may occur and cause misalignment of structures, e.g. dummy polycrystalline silicon structures formed on an edge of a fin end region for protection of the edge of the fin end region. The dummy polycrystalline silicon structure is called a 'dummy structure' because it will be subsequently removed and is not part of the circuitry. Overlay shift, however, may shift the position of the dummy polycrystalline silicon structure formed at the edge of a fin end region to a region away from the fin end, forming a narrow gap adjacent to the fine end. This narrow gap does not allow a complete formation of a protective layer, e.g. sidewall layer, and prevents the protective layer from carrying out its designed function (e.g. shielding the source/drain epitaxial layer from etchant). This may lead to defects such as a damaged source/drain epitaxial layer by etching with a loss of material of the source/drain epitaxial layer and/or a chemical alteration of the source/drain epitaxial layer. Such defects could cause the entire wafer to be defective and, therefore, discarded. When the gap is sufficiently wide due to overlay shift, the protective layer can still be formed completely and the overlay shift does not cause the defect formation.

Much effort has been applied to model overlay so as to solve the overlay shift problem. For example, the linear overlay model is designed for such purpose. Without negligible field to field and wafer to wafer overlay variations, the total overlay shift in a specific in-plane direction along a major surface of the wafer is equal to the sum of the translation overlay parameter, magnification overlay parameter, rotation overlay parameter, and a residual overlay parameter. Along with the downscaling of device dimension to nanoscale, the control of overlay shift is critical to the critical dimension (CD) variability. Embodiments of the present disclosure are described therein.

Figure 1:
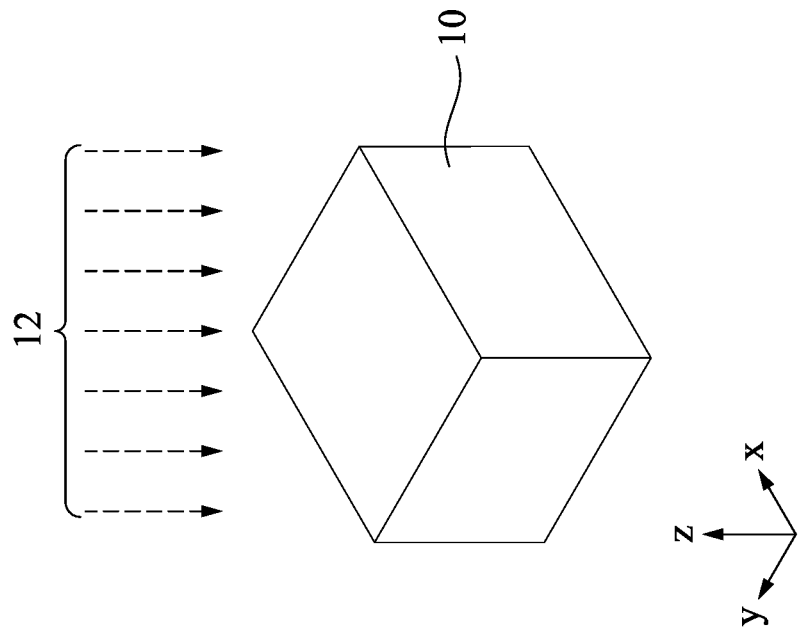
FIG. 1 shows a schematic view of a processing operation of a substrate, according to an embodiment of the present disclosure.

As shown in FIG. 1, impurity ions (dopants) 12 are implanted into a semiconductor substrate 10 to form a well region. The ion implantation is performed to prevent a punch-through effect. In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments of the present disclosure, the substrate 10 includes various regions that have been suitably doped with impurities (e.g., p-type or n-type conductivity). The dopants 12 are, for example, boron ($BF_2$) for an n-type FinFET and phosphorus for a p-type FinFET.

In FIG. 2, stacked semiconductor layers are formed over the substrate 10, in a case where a gate all-around (GAA) field effect transistor (FET) is fabricated. The stacked semiconductor layers include first semiconductor layers 20 and second semiconductor layers 21. The first semiconductor layers 20 and the second semiconductor layers 21 are formed of materials having different lattice constants, and include one or more layers of Si, Ge, SiGe, GaAs, InSb, GaP, GaSb, InAlAs, InGaAs, GaSbP, GaAsSb or InP, according to some embodiments of the present disclosure.

In some embodiments, the first semiconductor layers 20 and the second semiconductor layers 21 are formed of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 21 are Si or $Si_{1-y}Ge_y$, where y is less than about 0.4 and x>y. In this disclosure, an "M" compound" or an "M based compound" means the majority of the compound is M.

In another embodiment, the second semiconductor layers 21 are $Si_{1-y}Ge_y$, where y is more than about 0.3, or Ge, and the first semiconductor layers 20 are Si or $Si_{1-x}Ge_x$, where x is less than about 0.4 and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4.

Also, in FIG. 2, five layers of the first semiconductor layer 20 and six layers of the second semiconductor layer 21 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 21 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 21 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer 20 (the closest layer 20 to the substrate 10) is thicker than the remaining first semiconductor layers 20. The thickness of the bottom first semiconductor layer 20 is in a range from about 10 nm to about 50 nm in some embodiments, or is in a range from about 20 nm to about 40 nm in other embodiments.

Further, in FIG. 2, a mask layer 30 is formed over the stacked layers 20 and 21. In some embodiments, the mask layer 30 includes a first mask layer 31 and a second mask layer 32. The first mask layer 31 is a pad oxide layer made of a silicon oxide, which can be formed by a thermal oxidation. The second mask layer 32 is made of a silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photo-lithography and etching. In some embodiments, the first mask layer 31 is made of silicon nitride and the second mask layer 32 is made of silicon oxide.

Figure 3A:
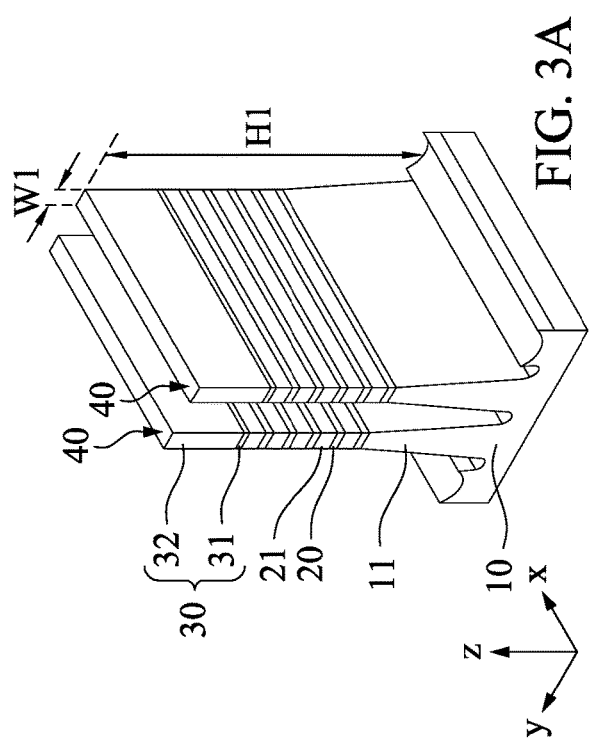
FIG. 3A shows a schematic view of fin structures made from the substrate and the stacked layers formed on the substrate of FIG. 2, according to an embodiment of the present disclosure.
Figure 3B:
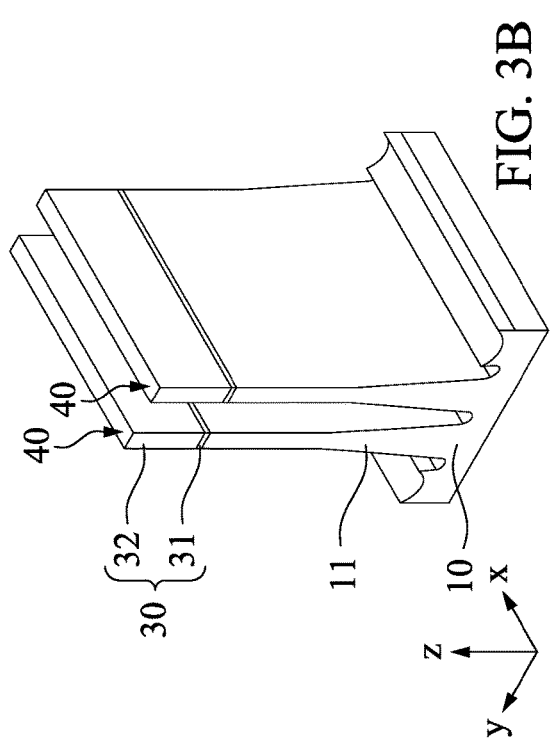
FIG. 3B shows a schematic view of fin structures, according to another embodiment of the present disclosure.
Figure 4A:
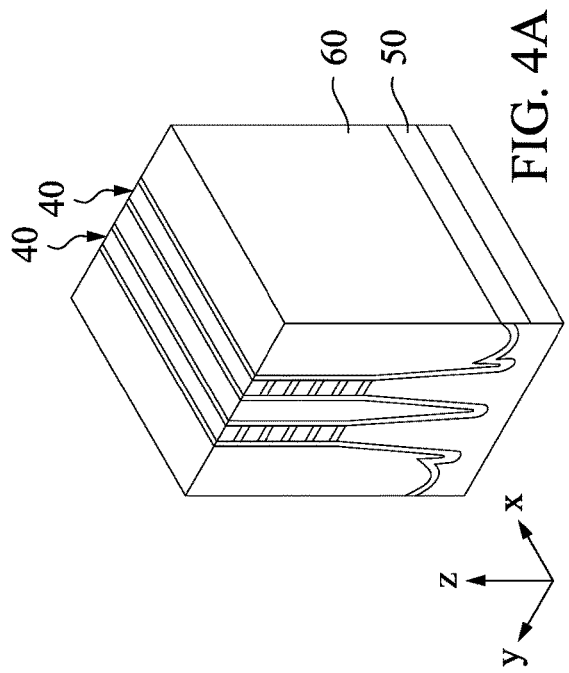
FIG. 4A shows a schematic view of the processed substrate of FIG. 3A, according to an embodiment of the present disclosure.
Figure 4B:
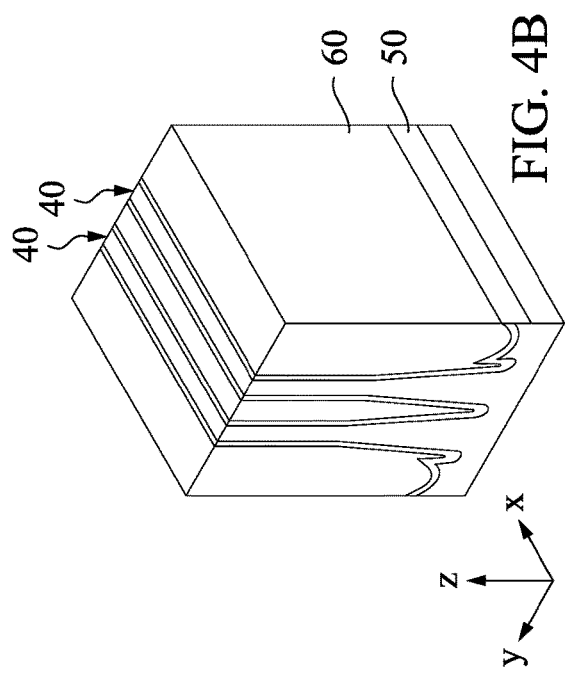
FIG. 4B shows a schematic view of the processed substrate of FIG. 3B, according to another embodiment of the present disclosure.

When the semiconductor device is a FinFET, no stacked layers are formed (see FIGS. 3B and 4B). In some embodiments, one or more epitaxial layers for a channel region are formed over the substrate 10. For GAA FET devices, operations shown in FIGS. 3A and 4A are applied. In FIG. 3A, the stacked layers of the first and second semiconductor layers 20, 21 are patterned by using the patterned mask layer 30, thereby the stacked layers 20 and 21 are formed into fin structures 40 extending in a lengthwise direction along the x direction. In some embodiments of the present disclosure, the fin structures 40 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In FIG. 3A, two fin structures 40 are arranged in they direction but the number of the fin structures 40 is not limited to, and may be as small as one and three or more in some embodiments of the present disclosure. In some embodiments, one or more dummy fin structures are formed on both sides of the fin structures 40 to improve pattern fidelity in the patterning operations. As shown in FIG. 3A, the fin structures 40 have upper portions constituted by the stacked semiconductor layers 20, 21 and well portions 11. The width W1 of the upper portion of the fin structure 40 along they direction is in a range from about 10 nm to about 40 nm in some embodiments, and is in a range from about 20 nm to about 30 nm in other embodiments. The height H1 along the z direction of the fin structure 40 is in a range from about 100 nm to about 200 nm.

FIG. 3B shows the case for a FinFET device. For a FinFET device, the substrate 10 (and/or an epitaxial layer formed over the substrate) is etched to form one or more fin structures. In FIG. 3B, the mask layer 30 including first mask layer 31 and second mask layer 32 formed on the substrate 10 is patterned by using the patterned mask layer 30, thereby the substrate 10 is formed into fin structures 40 extending in the lengthwise direction along the x direction. In FIG. 3B, two fin structures 40 are arranged in they direction but the number of the fin structures 40 is not limited to two, and may be as small as one and three or more in some embodiments of the present disclosure, depending on the desired device performance and device architecture. In some embodiments, one or more dummy fin structures (not shown) are formed on both sides of the fin structures 40, i.e. between the two fin structures 40, to improve pattern fidelity in the patterning operations such as photolithographic patterning of the mask layer 30. As shown in FIG. 3B, the substrate 10 has well portions 11.

After the fin structures 40 are formed in FIG. 3A or FIG. 3B, an insulating material layer 60 including one or more layers of insulating material is formed over the substrate 10 in FIG. 4A or FIG. 4B so that the fin structures 40 are fully embedded in the insulating material layer 60. The insulating material for the insulating material layer 60 includes silicon oxide, silicon nitride, silicon oxynitride, silicon carbon nitride, silicon carbon oxynitride, fluorine-doped silicate glass (FSG), or a low-k dielectric material, formed by LPCVD (low pressure chemical vapor deposition), plasma-CVD or flowable CVD. An anneal operation is performed after the formation of the insulating layer 60 in some embodiments of the present disclosure. Then, a planarization operation, such as a chemical mechanical polishing (CMP) method and/or an etch-back method, is performed such that the upper surface of the uppermost second semiconductor layer 21 or fin structure 40 is exposed from the insulating material layer 60 as shown in FIGS. 4A and 4B. In some embodiments, the first and second mask layers 31 and 32 are removed by the CMP as shown in FIGS. 4A and 4B, and in other embodiments, the CMP operation stops on the second mask layer 32. In some embodiments, a first liner layer or fin liner 50 is formed over the structure of FIGS. 3A and 3B before forming the insulating material layer 60, as shown FIG. 4A or FIG. 4B. The fin liner or first liner layer 50 is formed of silicon nitride or a silicon nitride-based material (e.g., silicon oxynitride Si—O—N, silicon carbon nitride Si—C—N, or silicon carbon oxynitride Si—C—O—N).

Then, as shown in FIG. 5A or FIG. 5B, the insulating material layer 60 is recessed to form an isolation insulating layer 60 so that the upper portions of the fin structures 40 are exposed. With this operation, the substrate 10 and the well portions 11 of the fin structures 40 are electrically separated from each other by the isolation insulating layer 60, which is also called a shallow trench isolation (STI) layer. In the embodiment shown in FIG. 5A, the insulating material layer 60 is recessed until the bottommost first semiconductor layer 20 is exposed. In other embodiments of the present disclosure, the upper portion of the well layer 11 is also partially exposed. The first semiconductor layers 20 are sacrificial layers which are subsequently partially removed, and the second semiconductor layers 21 are subsequently formed into channel layers of a GAA FET device.

After the isolation insulating layer 60 is formed, a sacrificial gate dielectric layer 70 is formed, as shown in FIG. 6A or FIG. 6B. The sacrificial gate dielectric layer 70 includes one or more layers of insulating material, such as a silicon oxide-based material including $SiO_2$. In one embodiment, silicon oxide formed by chemical vapor deposition (CVD), including low pressure CVD (LPCVD) and plasma enhanced CVD (PECVD), physical vapor deposition (PVD), atomic layer deposition (ALD), or other suitable process is used. The thickness of the sacrificial gate dielectric layer 70 is in a range from about 1 nm to about 5 nm in some embodiments of the present disclosure. The sacrificial gate dielectric layer 70 is formed over the fin structure 40.

Figure 8:
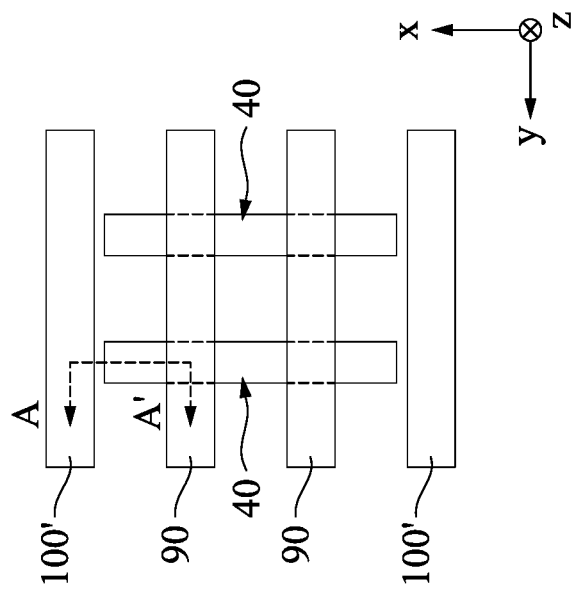
FIG. 8 shows a top plan view of the embodiment of FIG. 7.
Figure 7:
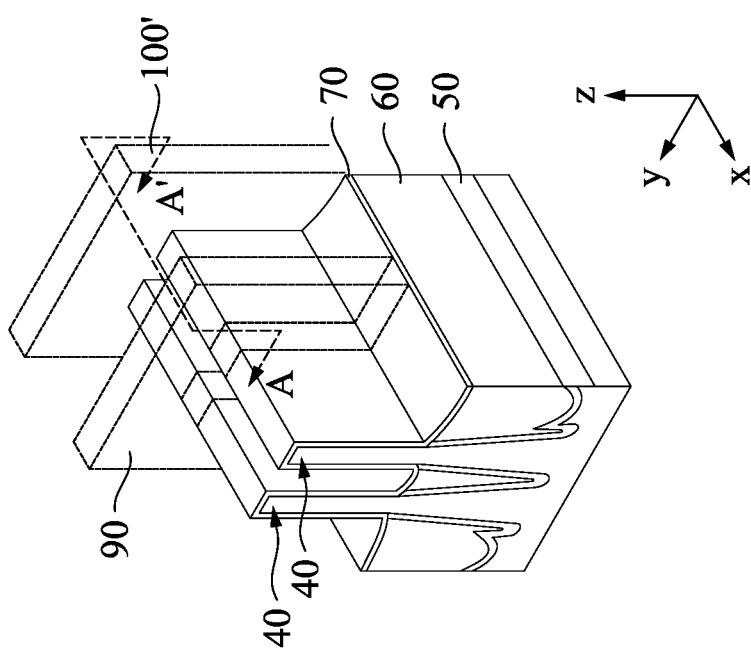
FIG. 7 shows a schematic view of an embodiment after processing the substrate of FIG. 6B.

Hereinafter, a manufacturing operation for a FinFET is explained. FIG. 7 shows a schematic view of the substrate of FIG. 6B with polycrystalline silicon dummy structures 90 and 100', according to an embodiment of the present disclosure and FIG. 8 shows a top plan view of the processed substrate of FIG. 7. In FIG. 7, in some embodiments of the present disclosure, the fin structures 40 are formed on the substrate 10 and extend in a lengthwise direction along x-direction. Each of the fin structures 40 has two fin edge regions at opposite ends along the lengthwise direction of the fin structures 40 along the x-direction. One or more channel regions are formed between the fin ends. In some embodiments of the present disclosure, the separation between the fin structures 40 depends on the device design, such as density of FinFET devices in a processor chip and the performance requirement of the semiconductor device having such a FinFET structure.

Also, in FIG. 7, the polycrystalline silicon dummy structures 100' are formed at a position adjacent to the fin ends of the fin structures 40 and are not formed over the fin structures 40. FIG. 8 shows a gap between the polycrystalline silicon dummy structure 100' and the fin structure 40. Also, polycrystalline silicon dummy structures 90 are formed over regions of the fin structures 40 between the fin edges or fin ends along the lengthwise direction in the x direction. The polycrystalline silicon dummy structures 90 are called 'dummy structures' and they will be removed and replaced with the gate structures of the FinFET devices, and the polycrystalline silicon dummy structures 100 are also 'dummy structures' because they will be subsequently removed. FIG. 8 shows a top plan view of the embodiment of FIG. 7. In FIG. 8, the polycrystalline silicon dummy structures 90 cover regions between the edges of fin ends of the fin structures 40 along a lengthwise direction of the fin structures 40. The polycrystalline silicon dummy structures 100' are not formed over the edges of ends of the fin structures 40. In some embodiments, the dummy structures 90 and 100' are formed of amorphous silicon or other suitable material.

Figure 19C:
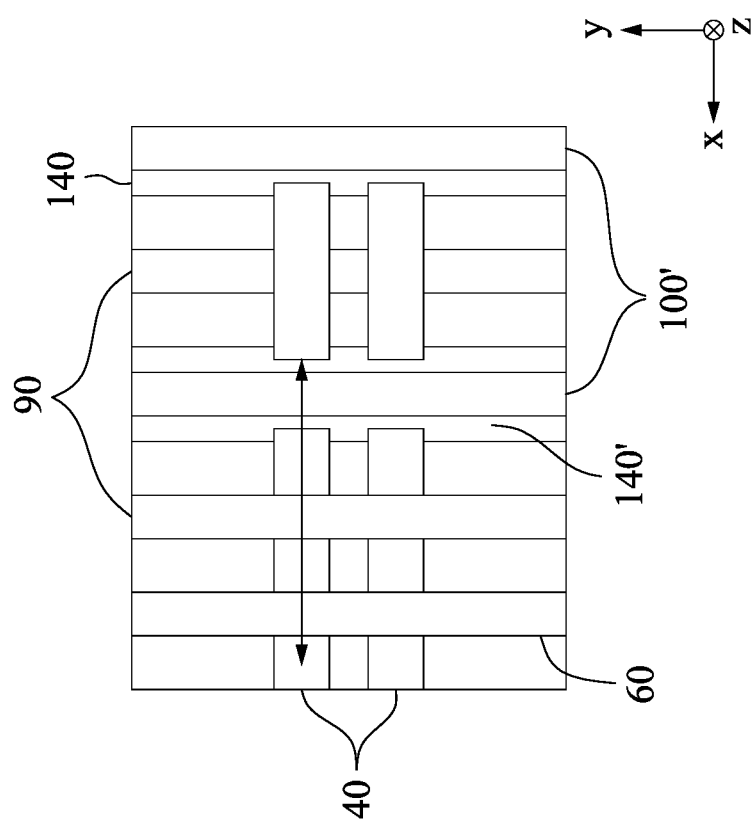

FIGS. 9A, 9B, 10A, 10B, 11A, 11B, 12A, 12B, 13A, 13B, 14A, 14B, 15A, 15B, 16A, 16B, 17A, 17B, 18A, 18B, 19A, 19B, 19C, 20A, 20B, 21A, 21B, 22A, 22B, 23A, 23B, 24A, 24A, 25A, and 25B show operations of manufacturing a semiconductor FinFET device according to an embodiment of the present disclosure. Each of the FIGS. 9A, 10A, 11A, 12A, 13A, 14A, 15A, 16A, 17A, 18A, 19A, 20A, 21A, 22A, 23A, 24A, and 25A includes a top plan view and each of the FIGS. 9B, 10B, 11B, 12B, 13B, 14B, 15B, 16B, 17B, 18B, 19B, 20B, 21B, 22B, 23B, 24B, and 25B includes a cross-sectional view of the semiconductor FinFET device along a cut line A-A in a plane including x and z axes of FIG. 7. FIG. 19C is a pan view. Throughout the various views and illustrative embodiments, like reference numbers are used to designate like elements. It is understood that additional operations can be provided before, during, and after processes shown by FIGS. 9A-24B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-6B may be employed in the following embodiments, and detailed explanation thereof may be omitted.

FIGS. 9A and 9B show an operation for fin-end patterning. In particular, FIG. 9A shows a top plan view of an embodiment of the present disclosure. Also, FIG. 9B is a cross-sectional view of the embodiment, showing the layered structure. The fin structure 40 has a bottom region 40i and a top active region 40a which is processed to form a channel region (not shown) and a source/drain region (not shown). As set forth above, after the fin structures are patterned by using the first and second mask layers 31 and 32 as shown in FIG. 5A or 5B, the insulating material layer 60 is formed to cover the patterned fin structures. Then, a CMP operation is performed to remove the upper portion of the insulating material layer 60 to form a STI layer 60. In this embodiment, the CMP stops on the upper surface of the second mask layer 32. In FIG. 9B, a silicon nitride layer 80a, which corresponds to the first mask layer 31, is formed on the fin active region 40a and an insulating oxide layer 80b, which corresponds to the second mask layer 32, is formed on the silicon nitride layer 80a.

In FIG. 9B, a fin liner 50 is formed on the bottom region 40i of the fin structures 40. A mask pattern 80c is formed on the insulating oxide layer 80b by a photolithographic method. The mask pattern 80c is formed of a light sensitive photoresist material in some embodiments.

FIGS. 10A and 10B show an operation for etching the insulating oxide layer 80b and the shallow trench isolation (STI) layer 60. The etching includes one or more dry etching and/or wet etching. FIG. 10A shows a top plan view and FIG. 10B shows a cross-sectional view. FIG. 10B shows that the shallow trench isolation (STI) layer 60 is recessed and the fin liner 50 is not etched. In some embodiments of the present disclosure, the STI layer 60 is recessed to have a top surface lower than the top surface of the fin liner 50. In this way, a deep plug 140' (FIG. 12B) can be formed. In other embodiments of the present disclosure, the STI layer 60 is recessed to have a top surface at the same level as or higher than the top surface of the fin liner 50.

FIGS. 10A and 10C show an operation for etching the insulating oxide layer 80b and the shallow trench isolation (STI) layer 60. The etching includes one or more dry etching and/or wet etching. FIG. 10A shows a top plan view and FIG. 10C shows a cross-sectional view. FIG. 10C shows that the shallow trench isolation (STI) layer 60 is recessed and the fin liner 50 is not etched. In some embodiments of the present disclosure, the STI layer 60 is recessed to have a top surface higher than the top surface of the fin liner 50. In other embodiments of the present disclosure, the STI layer 60 is recessed to have a top surface at the same level as the top surface of the fin liner 50.

FIGS. 11A and 11B show an operation for formation of sidewall spacer plug 140 for the fin end. The fin end sidewall spacer plug 140 for fin end is formed of an insulating material different from the STI layer 60. In some embodiments, the fin end sidewall spacer plug 140 includes one or more layers of a silicon nitride based insulating material, such as silicon nitride, silicon oxynitride, silicon carbon nitride, or silicon carbon oxynitride, by a deposition method, such as chemical vapor deposition (CVD), including low pressure CVD (LPCVD) and plasma enhanced CVD (PECVD); physical vapor deposition (PVD); atomic layer deposition (ALD); or other suitable process. FIG. 11A shows a top plan view of the sidewall spacer plug 140 and FIG. 11B shows a cross-sectional view. As shown in FIG. 11B, the fin end sidewall spacer plug 140 is formed to fill a space adjacent to an end of the fin in a lengthwise direction and the space is between ends of the fins.

FIGS. 11A and 11C show an operation for formation of sidewall spacer plug 140 for the fin end. The fin end sidewall spacer plug 140 for fin end is formed of an insulating material different from the STI layer 60. In some embodiments, the fin end sidewall spacer plug 140 includes one or more layers of a silicon nitride based insulating material, such as silicon nitride, silicon oxynitride, silicon carbon nitride, or silicon carbon oxynitride, by a deposition method, such as chemical vapor deposition (CVD), including low pressure CVD (LPCVD) and plasma enhanced CVD (PECVD); physical vapor deposition (PVD); atomic layer deposition (ALD); or other suitable process. FIG. 11A shows a top plan view of the sidewall spacer plug 140 and FIG. 11C shows a cross-sectional view. As shown in FIG. 11C, the fin end sidewall spacer plug 140 is formed to fill a space adjacent to an end of the fin in a lengthwise direction and the space is between ends of the fins.

FIGS. 12A and 12B show an operation for chemical and mechanical polishing (CMP) process to remove the layers on the fin structure 40. FIG. 12A shows a top plan view and FIG. 12B shows a cross-sectional view of an operation of manufacturing a semiconductor device according to an embodiment of the disclosure. By the CMP process, the upper surfaces of the fin structures 40a are exposed. In this way, a deep plug 140' is formed with a bottom level lower than the insulating material layer 60. The CMP process is performed such that upper surface of the fin structures 40 (40a) are and the upper surface of the deep plug 140' are substantially flush with each other (same height).

FIGS. 12A and 12C show an operation for chemical and mechanical polishing (CMP) process to remove the layers on the fin structure 40. FIG. 12A shows a top plan view and FIG. 12C shows a cross-sectional view of an operation of manufacturing a semiconductor device according to an embodiment of the disclosure. By the CMP process, the upper surfaces of the fin structures 40a are exposed. In this way, a shallow plug 140" is formed with a bottom level higher than the insulating material layer 60. The CMP process is performed such that upper surface of the fin structures 40 (40a) are and the upper surface of the deep plug 140" are substantially flush with each other (same height).

FIG. 13A shows a top plan view and FIGS. 13B and 13C show cross-sectional views of embodiments having a polycrystalline silicon layer 90' formed over a dummy oxide layer 200 on the deep plug 140' and the shallow plug 140", respectively. The dummy oxide layer 200, similar to the sacrificial gate dielectric layer 70, is formed on the fin structures and the upper surface of the fin end plug 140 (140' or 140"). In some embodiments, the oxide layer 200 is formed of insulating materials, such as silicon oxide by chemical vapor deposition (CVD), including low pressure CVD (LPCVD) and plasma enhanced CVD (PECVD); and physical vapor deposition (PVD), such as sputtering, or other suitable process. In some embodiments, the polycrystalline silicon layer 90' is formed using chemical vapor deposition (CVD), including low pressure CVD (LPCVD) and plasma enhanced CVD (PECVD); and physical vapor deposition (PVD), such as sputtering; or other suitable process.

FIG. 14A shows a top plan view and FIGS. 14B and 14C show cross-sectional views of embodiments having one or more hard mask layers formed on the polycrystalline silicon layer 90'. In some embodiments, the hard mask layer includes a first hard mask layer 90" made of, for example, silicon nitride. The first hard mask layer 90" is formed by using chemical vapor deposition (CVD), including low pressure CVD (LPCVD) and plasma enhanced CVD (PECVD); and physical vapor deposition (PVD), such as sputtering, atomic layer deposition (ALD) or other suitable process.

FIGS. 15A-22B show cross-sectional views of processes of embodiments having the deep plug 140' as an example. The processes of embodiments having the shallow plug 140" are not shown. One of ordinary skill in the art would readily understand, through the processes applied to embodiments having the deep plug 140', the similar processes applied to embodiments having the shallow plug 140".

In FIGS. 15A and 15B, a second hard mask layer 90''' made of, for example, silicon oxide, is formed on the first hard mask layer 90". The second hard mask layer 90''' is formed by using chemical vapor deposition (CVD), including low pressure CVD (LPCVD) and plasma enhanced CVD (PECVD); and physical vapor deposition (PVD), such as sputtering; atomic layer deposition (ALD); or other suitable process. In some embodiments, the first hard mask layer 90" is made of silicon oxide based material, such as silicon oxide, and the second hard mask layer 90''' is made of silicon nitride based material as set forth above.

Then, as shown in FIGS. 16A and 16B, a mask pattern M is formed on the second hard mask layer 90''' by spin coating and photolithographic method. The mask pattern M is formed of a light-sensitive photoresist layer. The region B outlined by the dotted line will be discussed in further details in FIGS. 17A-22B. FIGS. 17A and 17B show the enlarged region B of the embodiment of FIG. 16B.

FIGS. 18A and 18B show an operation of etching the oxide hard mask layer 90''', silicon nitride hard mask layer 90", and the polycrystalline silicon layer 90' using the mask pattern M. The etching is anisotropic dry etching in some embodiments. Through this operation, the polycrystalline dummy silicon structures 90 and 100' are defined. The polycrystalline dummy silicon structure 90 is formed on a region in the fin structure 40, and the polycrystalline silicon dummy structure 100' is formed on a region spaced-apart from the fin end of the fin structure 40, e.g., between the ends of two adjacent fin structures. Since the plug 140' is made of a silicon nitride based material, which is the same as or similar to the material of the second hard mask layer 90''', the plug 140' is not substantially etched in the patterning operation of the silicon dummy structure 100'.

FIGS. 19A, 19B and 19C show an operation according to some embodiments of the present disclosure. In this operation, a gate sidewall spacer layer 150 is conformally formed on the patterned polycrystalline silicon dummy structures of FIGS. 18A and 18B. After the gate sidewall spacer layer 150 is formed, anisotropic etching is performed to remove the gate sidewall spacer layer 150 formed on the top of the polycrystalline silicon dummy structures 90 and 100' and on the upper surface of the fin structure 40 (as shown in FIGS. 19A and 19B). The conformally formed gate sidewall spacer layer 150 fully covers the polycrystalline dummy silicon structure 100' because the fin end spacer plug 140' fills a space adjacent to an end of the fin and a narrow gap is not formed. The gate sidewall spacer layer 150 protects the source/drain epitaxial layer from being etched. Since the gate sidewall spacer layer 150 is completely formed and the fin end spacer plug 140' fills the spacer between the fins, a subsequently formed source/drain epitaxial layer is fully protected from a subsequent etch process.

As shown in FIG. 19C, the polycrystalline dummy silicon structure 100' is provided between ends of two fin structures 40 and does not overlap the fin structures. No dummy silicon structure is disposed above the ends (edge) of the fin structures in some embodiments. The fin end spacer plug 140' electrically and physically separates the polycrystalline dummy silicon structure 100' and the fin structures. Accordingly, after the dummy polysilicon structures 90 and 110' are replaced with metal gate structures in the subsequent operations, it is possible to secure electrical separation between the dummy metal gate formed by replacing the polycrystalline dummy silicon structure 100' with a metal gate structure and the fin structures 40. In addition, compared with the case where two polycrystalline dummy silicon structures are disposed over the ends of two fin structures, respectively, the layout shown in FIG. 19C can reduce a distance between the ends of two adjacent fin structures by about 5-6% and also reduce a cell size by about 6%.

FIGS. 20A and 20B show an operation according to an embodiment of the present disclosure. In FIGS. 20A and 20B, a source/drain recess 110 is formed in the fin active region 40a (not shown) by etching the fin active region 40a. The fin-end sidewall spacer plug 140' is not etched in the region between the polycrystalline silicon dummy structures 90 and the polycrystalline silicon dummy structures 100' during etching of the fin active region 40a. Thus, the etched portion of the active region 40a is laterally separated from the polycrystalline silicon layer 90 of the polycrystalline silicon dummy structures 100'. Although the fin-end sidewall spacer plug 140' is exposed in the source/drain recess 110 (the right one) in FIG. 20B, a part of the fin active region 40a remains between the fin-end sidewall spacer plug 140' and the source/drain recess 110 in other embodiments. If the layer 140' (or 140") is not formed on the insulating material layer 60 (STI), the polycrystalline silicon dummy structures 100' is formed on the insulating material layer 60 with the thin dummy oxide layer 200 interposed therebetween. One of the gate sidewall spacers 150 at the fin side may not be sufficiently formed on the polycrystalline silicon dummy structures 100' due to the small space between the polycrystalline silicon dummy structures 100' and the fin structure. In such case, when etching the source/drain region, the source/drain recess 110 is connected to the polycrystalline silicon dummy structures 100', which may cause a defect in the subsequent epitaxial layer formation. In contrast, by using the layer 140 to increase the bottom height of the polycrystalline silicon dummy structures 100', it is possible to prevent the defect in the subsequent epitaxial layer formation.

FIGS. 21A and 21B show an operation according to an embodiment of the present disclosure. In FIGS. 21A and 21B, source/drain epitaxial layer 120 is deposited in the source/drain recess 110 formed in the fin active region 40a. In some embodiments, the source/drain epitaxial layer includes SiP, SiGe, etc. The source/drain epitaxial layer 120 is separated from the polycrystalline silicon dummy structures 90 and 100' by the fin end sidewall spacer plug 140' and/or the gate sidewall spacers 150 of the polycrystalline silicon dummy structures 100'.

FIGS. 22A and 22B show an operation of depositing an interlayer dielectric (ILD) layer 130 on the source/drain epitaxial layer 120 and removing the polycrystalline silicon dummy structures 90 and 100' without removing the sidewall spacers 150. In some embodiments, a contact etch stop layer (CESL) is formed over the structure of FIGS. 21A and 21B before the ILD layer 130 is formed. During the process of removing the polycrystalline silicon dummy structures 90 and 100', the source/drain epitaxial layer 120 is covered by the fin-end sidewall spacer plug 140' and the ILD layer 130 and is thus not etched or removed, preserving the source/drain epitaxial layer 120 at fin end of the fin structure 40. In this way, the source/drain epitaxial layer 120 is not etched even if the gate sidewall spacer layer 150 which is supposed to protect the source/drain epitaxial layer 120 from etching is not fully formed. In some embodiments, the polycrystalline silicon dummy structure 100' is not removed in the gate replacement operation.

After the polycrystalline silicon dummy structures 90 and 100' are removed, a gate dielectric layer (not shown) is formed over the channel regions of the fin structure 40 and the fin-end sidewall spacer plug 140', and a gate electrode layer 190 is formed on the gate dielectric layer, as shown in FIGS. 22A and 22B. In certain embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer may be formed from CVD, ALD or any suitable method. In one embodiment, the gate dielectric layer is formed using a highly conformal deposition process such as ALD in order to ensure the formation of a gate dielectric layer having a uniform thickness around each channel regions. The thickness of the gate dielectric layer is in a range from about 1 nm to about 6 nm in one embodiment. In some embodiments, the gate dielectric layer is conformally formed in a space from which the polycrystalline silicon dummy structures 90 and 100' are removed.

The gate electrode layer 190 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 190 may be formed from CVD, ALD, electro-plating, or other suitable method. The gate electrode layer is also deposited over the upper surface of the ILD layer 130. The gate dielectric layer and the gate electrode layer formed over the ILD layer 130 is then planarized by using, for example, CMP, until the top surface of the ILD layer 130 is revealed as shown in FIG. 17A.

In certain embodiments of the present disclosure, one or more work function adjustment layers (not shown) are interposed between the gate dielectric layer and the gate electrode layer 190. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The gate electrode 195 formed over the fin-end sidewall spacer plug 140' is a dummy gate electrode, which does not function as a part of electric circuitry. As set forth above, the dummy gate electrode 195 is separated from the source/drain epitaxial layer 120 from the fin-end sidewall spacer plug 140' as shown in FIG. 22B.

Figure 24:
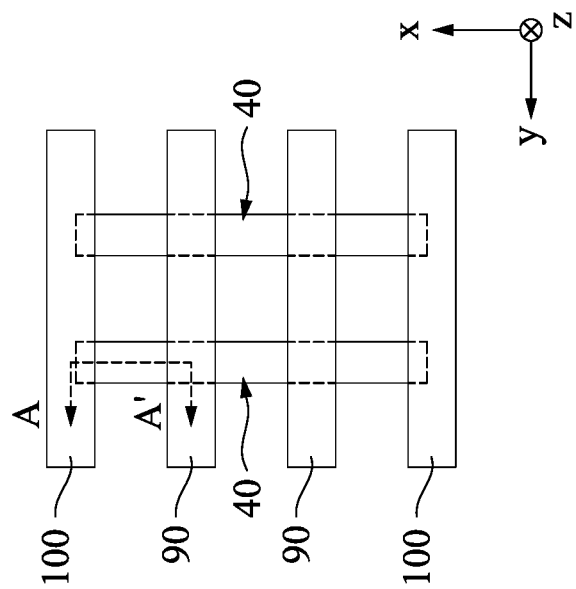
FIG. 24 shows a top plan view of the embodiment of FIG. 23.
Figure 23:
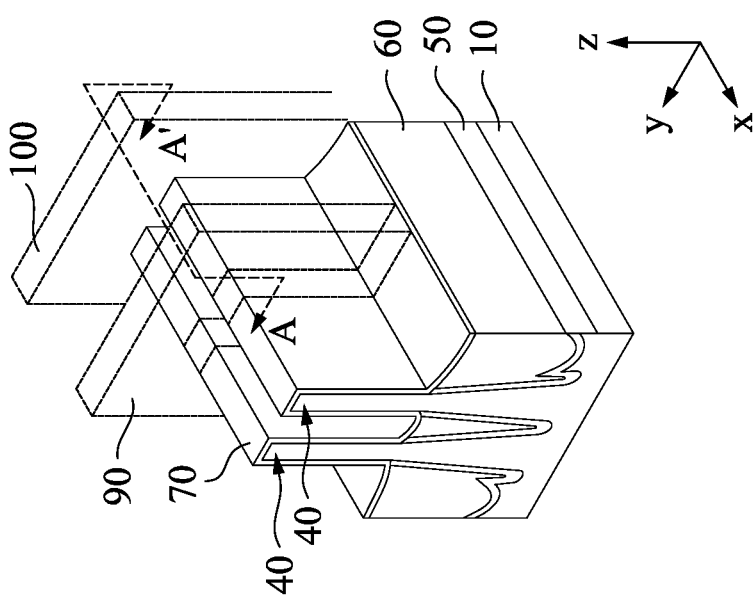
FIG. 23 shows a schematic view of another embodiment after processing the substrate of FIG. 6B.

Hereinafter, a manufacturing operation for a FinFET according to another embodiment is explained. FIG. 23 shows a schematic view of the substrate of FIG. 6B with polycrystalline silicon dummy structures 90 and 100, according to an embodiment of the present disclosure and FIG. 24 shows a top plan view of the processed substrate of FIG. 28. In FIG. 23, in some embodiments of the present disclosure, the fin structures 40 are formed on the substrate 10 and extend in a lengthwise direction along x-direction. Each of the fin structures 40 has two fin edge regions at opposite ends along the lengthwise direction of the fin structures 40 in the x-direction. One or more channel regions are formed between the fin ends. In some embodiments of the present disclosure, the separation between the fin structures 40 depends on the device design.

Also, in FIG. 23, the polycrystalline silicon dummy structure 100 is formed over the fin ends of the fin structures 40. As shown in FIG. 24, there are no gaps between the polycrystalline silicon dummy structure 100 and the fin structure 40, and the polycrystalline silicon dummy structure 100 overlaps the ends of the fin structure 40. The polycrystalline silicon dummy structures 90 are formed over regions of the fin structures 40 between the fin ends along the lengthwise direction (i.e. x direction). FIG. 24 shows a top plan view of the embodiment of FIG. 23. In some embodiments, the dummy structures 90 and 100' are formed of amorphous silicon or other suitable material.

FIGS. 25A, 25B, 26A, 26B, 26C, 27A, 27B, 27C, 28A, 28B, 28C, 29A, 29B, 29C, 30A, 30B, 30C, 31A, 31B, 32A, 32B, 33A, 33B, 34A, 34B, 35A, 35B, 36A, 36B, 37A, 37B, 38A, and 38B show operations of manufacturing a semiconductor FinFET device according to an embodiment of the present disclosure. Each of FIGS. 25A, 26A, 27A, 28A, 29A, 30A, 31A, 32A, 33A, 34A, 35A, 36A, 37A, and 38A includes a top plan view and each of FIGS. 25B, 26B, 26C, 27B, 27C, 28B, 28C, 29B, 29C, 30B, 30C, 31B, 32B, 33B, 34B, 35B, 36B, 37B, and 38B includes a cross-sectional view of the semiconductor FinFET device along a cut line A-A in a plane including x and z axes of FIG. 1. Throughout the various views and illustrative embodiments, like reference numbers are used to designate like elements. It is understood that additional operations can be provided before, during, and after processes shown by FIGS. 25A-38B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-22B may be employed in the following embodiments, and detailed explanation thereof may be omitted.

FIGS. 25A and 25B show an operation for fin-end patterning. In particular, FIG. 25A shows a top plan view of an embodiment of the present disclosure. Also, FIG. 25B shows a cross-sectional view of the embodiment, indicating the layering structure. The fin structure 40 has a bottom region 40i and a top active region 40a which is processed to form a channel region (not shown) and a source/drain region (not shown). As set forth above, after the fin structures 40 are patterned by using the first and second mask layers 31 and 32 as shown in FIG. 5A or 5B, the insulating material layer 60 is formed to cover the patterned fin structures 40. Then, a CMP operation is performed to remove the upper portion of the insulating material layer 60 to form an STI layer 60. In this embodiment, the CMP stops on the upper surface of the second mask layer 32. In FIGS. 25A and 25B, a silicon nitride layer 80a, which corresponds to the first mask layer 31, is formed on the fin active region 40a, and an insulating oxide layer 80b, which corresponds to the second mask layer 32, is formed on the silicon nitride layer 80a.

In FIG. 25B, a fin liner 50 is formed on the bottom region 40i of the fin structures 40. A mask pattern 80c is subsequently formed on the insulating oxide layer 80b by a photolithographic method. The mask pattern 80c is formed of a light sensitive photoresist material in some embodiments.

FIGS. 26A and 26B show an operation for etching the insulating oxide layer 80b and the shallow trench isolation (STI) layer 60. The etching includes one or more dry etching and/or wet etching. FIG. 26A shows a top plan view, and FIG. 26B shows a cross-sectional view of the embodiment. FIG. 26B shows that the shallow trench isolation (STI) layer 60 is recessed and the fin liner 50 is not etched. In some embodiments of the present disclosure, the STI layer 60 is recessed to have a top surface lower than the top surface of the fin liner 50. In some embodiments of the present disclosure, the STI layer 60 is recessed to have a top surface at the same level as the top surface of the fin liner 50.

FIGS. 26A and 26C show an operation for etching the insulating oxide layer 80b and the shallow trench isolation (STI) layer 60. The etching includes one or more dry etching and/or wet etching. FIG. 26A shows a top plan view, and FIG. 26C shows a cross-sectional view of the embodiment. FIG. 26B shows that the shallow trench isolation (STI) layer 60 is recessed and the fin liner 50 is not etched. In some embodiments of the present disclosure, the STI layer 60 is recessed to have a top surface higher than the top surface of the fin liner 50. In some embodiments of the present disclosure, the STI layer 60 is recessed to have a top surface at the same level as the top surface of the fin liner 50.

FIGS. 27A and 27B show an operation for formation of sidewall spacer plug 140 for fin end. The fin end sidewall spacer plug 140 for fin end is formed of a silicon nitride based insulating material, such as silicon nitride, silicon oxynitride, silicon carbon nitride, or silicon carbon oxynitride, by a deposition method, such as chemical vapor deposition (CVD), including low pressure CVD (LPCVD) and plasma enhanced CVD (PECVD); physical vapor deposition (PVD); atomic layer deposition (ALD); or other suitable process. As shown in FIGS. 27A and 27B, the fin-end sidewall spacer plug 140 is conformally formed. The thickness of the fin-end sidewall spacer plug 140 is in a range from about 10 nm to about 50 nm in some embodiments, and is in a range from about 20 nm to about 40 nm in other embodiments.

FIGS. 27A and 27C show an operation for formation of sidewall spacer plug 140 for fin end. The fin end sidewall spacer plug 140 for fin end is formed of a silicon nitride based insulating material, such as silicon nitride, silicon oxynitride, silicon carbon nitride, or silicon carbon oxynitride, by a deposition method, such as chemical vapor deposition (CVD), including low pressure CVD (LPCVD) and plasma enhanced CVD (PECVD); physical vapor deposition (PVD); atomic layer deposition (ALD); or other suitable process. As shown in FIGS. 27A and 27C, the fin-end sidewall spacer plug 140 is conformally formed. The thickness of the fin-end sidewall spacer plug 140 is in a range from about 10 nm to about 50 nm in some embodiments, and is in a range from about 20 nm to about 40 nm in other embodiments.

FIGS. 28A and 28B show an operation for chemical and mechanical polishing (CMP) process to remove the layers over the fin structure 40. By the CMP process, the upper surfaces of the fin structures 40 are exposed. In this way, a deep plug 140' is formed.

A dummy oxide layer 200, similar to the sacrificial gate dielectric layer 70, is formed on the fin structures and the upper surface of the deep plug or fin end spacer plug 140' as shown in FIGS. 28A and 28B. In some embodiments, the dummy oxide layer 200 is formed of insulating materials such as silicon oxide by chemical vapor deposition (CVD), including low pressure CVD (LPCVD) and plasma enhanced CVD (PECVD); and physical vapor deposition (PVD) such as sputtering; or other suitable process.

FIGS. 28A and 28C show an operation for chemical and mechanical polishing (CMP) process to remove the layers over the fin structure 40. By the CMP process, the upper surfaces of the fin structures 40 are exposed. In this way, a shallow plug 140" is formed.

A dummy oxide layer 200, similar to the sacrificial gate dielectric layer 70, is formed on the fin structures and the upper surface of the fin end spacer plug 140" as shown in FIGS. 28A and 28C. In some embodiments, the dummy oxide layer 200 is formed of insulating materials such as silicon oxide by chemical vapor deposition (CVD), including low pressure CVD (LPCVD) and plasma enhanced CVD (PECVD); and physical vapor deposition (PVD) such as sputtering; or other suitable process.

In FIGS. 29A, 29B, and 29C, a polycrystalline silicon layer 90' is formed over the dummy oxide layer 200. In some embodiments, the polycrystalline silicon layer 90' is formed using chemical vapor deposition (CVD), including low pressure CVD (LPCVD) and plasma enhanced CVD (PECVD); and physical vapor deposition (PVD) such as sputtering; or other suitable process.

One or more hard mask layers is formed on the polycrystalline silicon layer 90' as shown in FIGS. 30A, 30B, and 30C. In some embodiments, the hard mask layer includes a first hard mask layer 90" made of, for example, silicon nitride. The hard mask layer 90" is formed by using chemical vapor deposition (CVD), including low pressure CVD (LPCVD) and plasma enhanced CVD (PECVD); and physical vapor deposition (PVD) such as sputtering; atomic layer deposition (ALD) or other suitable process.

FIGS. 31A-38B show cross-sectional views of processes of embodiments having the deep plug 140' as an example. The processes of embodiments having the shallow plug 140" are not shown. One of ordinary skill in the art would readily understand, through the processes applied to embodiments having the deep plug 140', the similar processes applied to embodiments having the shallow plug 140".

Figure 31A:
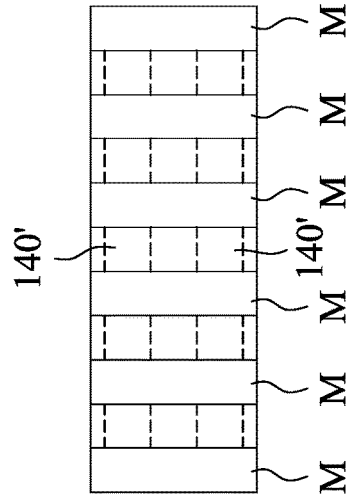
Figure 32A:
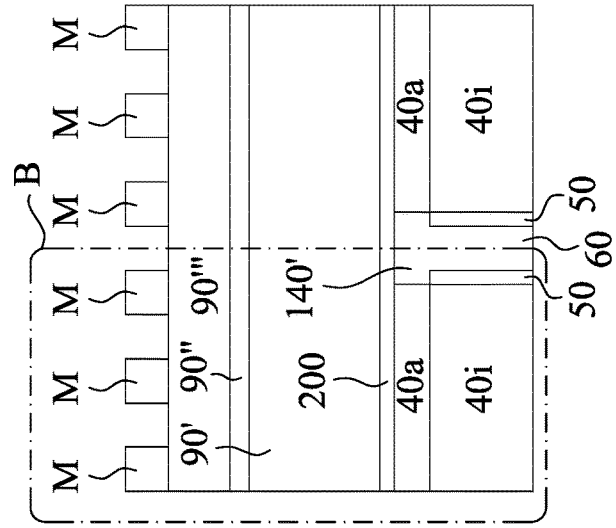
Figure 31B:
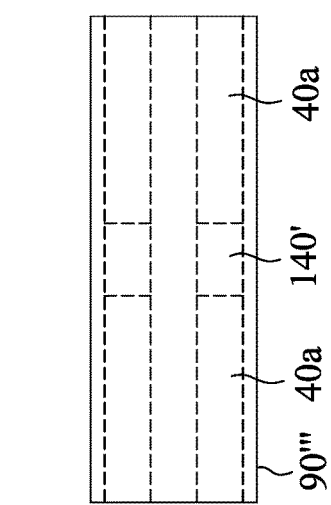
Figure 32B:
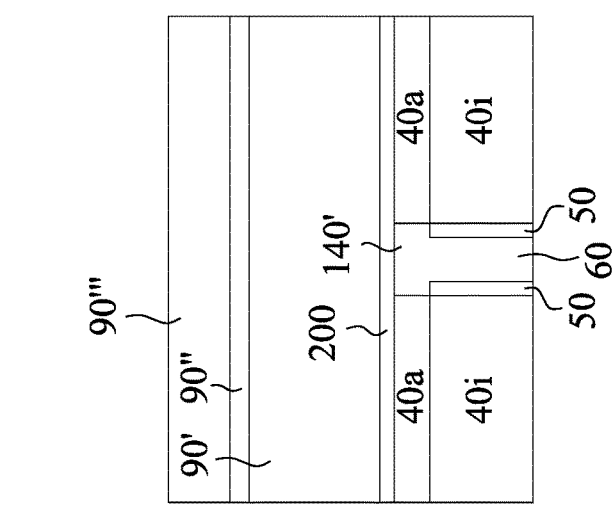

In FIGS. 31A and 31B, a second hard mask layer 90''' made of, for example, silicon oxide, is formed on the first hard mask layer 90". The second hard mask layer 90''' is formed by using chemical vapor deposition (CVD), including low pressure CVD (LPCVD) and plasma enhanced CVD (PECVD), and physical vapor deposition (PVD) such as sputtering, atomic layer deposition (ALD) or other suitable process. Then, as shown in FIGS. 32A and 32B, a mask pattern M is formed on the second hard mask layer 90''' by spin coating and a photolithographic method. The mask pattern M is formed of a light-sensitive photoresist layer in some embodiments. The region B outlined by the dotted line will be discussed in further details in FIGS. 33A-33B. FIGS. 33A and 33B show the enlarged region B of the embodiment of FIG. 32B.

FIGS. 34A and 34B show an operation of etching the oxide hard mask layer 90''', silicon nitride hard mask layer 90", and the polycrystalline silicon layer 90' using the mask pattern M. The etching is anisotropic dry etching in some embodiments. Through this operation, the polycrystalline dummy silicon structures 90 and 100 are defined. The polycrystalline silicon dummy structures 90 are formed on a region in the fin structure 40, and the polycrystalline silicon dummy structures 100 are formed on an edge of the fin end of the fin structure 40.

FIGS. 35A and 35B show an operation according to some embodiments of the present disclosure. In this operation, a gate sidewall spacer layer 150 is conformally formed on the patterned polycrystalline silicon dummy structures of FIGS. 35A and 35B. After the gate sidewall spacer layer 150 is formed, anisotropic etching is performed to remove the gate sidewall spacer layer 150 formed on the top of the polycrystalline silicon dummy structures 90 and 100 and on the upper surface of the fin structure 40.

FIGS. 36A and 36B show an operation according to an embodiment of the present disclosure. In FIGS. 36A and 36B, a source/drain recess 110 is formed in the fin active region 40a by etching the fin active region 40a. In the etching of the fin active region 40a, at the region between the polycrystalline silicon dummy structures 90 and the polycrystalline silicon dummy structures 100, the fin-end sidewall spacer plug 140' and/or the gate sidewall spacer 150 on the polycrystalline silicon dummy structures 100 is not etched, and thus the etched portion of the active region 40a is laterally separated from the polycrystalline silicon layer 90 of the polycrystalline silicon dummy structures 100.

FIGS. 37A and 37B show an operation according to an embodiment of the present disclosure. In FIGS. 37A and 37B, a source/drain epitaxial layer 120 including Si—P is deposited in the source/drain recess 110 formed in the fin active region 40a. The source/drain epitaxial layer 120 is separated from the polycrystalline silicon dummy structures 90 and 100 by the sidewall spacer plug 140'.

FIGS. 38A and 38B show an operation of depositing an insulating dielectric layer 130 on the source/drain epitaxial layer 120 and removing the polycrystalline silicon dummy structures 90 and 100' without removing the sidewall spacers 150. Because fin-end sidewall spacer plug 140' covers the edge of the fin structure, the source/drain epitaxial layer 120 is not etched or removed. The fin end spacer plug 140' provides protection, preserving the source/drain epitaxial layer 120 at the end of the fin structure 40.

In the above embodiments, the positions of the polycrystalline silicon dummy structures 100 (FIGS. 23-43B) and 100' (FIGS. 7-24B) are different. Because of the structure of the sidewall spacer 150 and the fin end spacer plug 140' fully covering or enclosing the polycrystalline silicon dummy structures 90, 100, and 100' and the fin 40, the source/drain epitaxial layers 120 can still be maintained intact without being etched or chemically altered through subsequent semiconductor processing.

Overlay shift causes misalignment of structures and the formation of an undesirable narrow gap, which does not allow the protective layers of a device to be fully formed, thereby causing defects in device. In the foregoing embodiments, a fin-end sidewall spacer plug 140' is employed to protect the source/drain epitaxial layer and fin ends during dummy polycrystalline silicon removal.

The various embodiments or examples described herein offer several advantages over the existing art. For example, in the present disclosure, the fin end sidewall spacer plug 140' preserves the source/drain epitaxial layer 120 at fin end of the fin structure 80 even when overlay shift occurs and the spacer layers 150 is not completely formed due to the narrowness of a gap adjacent to a fin end.

It will be understood that not all advantages have been necessarily discussed herein, no particular advantage is required for all embodiments or examples, and other embodiments or examples may offer different advantages. In accordance with an aspect of the present disclosure, in a method of manufacturing a semiconductor device, a first isolation insulating layer is formed between fins. A second isolation insulating layer, as a fin end spacer plug, is formed over the first isolation insulating layer, filling a space adjacent to ends of the fins in a lengthwise direction. A dummy oxide layer is formed over the fin, the fin end spacer plug, and the first isolation insulating layer. Polycrystalline silicon layers are formed on a region in the fin and on an edge region of the fin at an end in the lengthwise direction. Sidewall spacer layers are formed on the polycrystalline silicon layers. A source/drain region of the fin, which is not covered by the sidewall spacer layers, is etched to form a source/drain space. A source/drain epitaxial layer is formed in the source/drain space. After the source/drain epitaxial layer is formed, forming a contact layer and etching the polycrystalline silicon layers.

In accordance with an aspect of the present disclosure, in a method of manufacturing a semiconductor device, an insulating layer is formed on a surface of an end of a fin along a lengthwise direction. A fin end spacer plug is formed on the insulating layer. A dummy oxide layer is formed over the fin, the fin end spacer plug, and the insulating layer. Polycrystalline silicon layers are formed on a region on the fin and on a region spaced-apart from the fin. Sidewall spacer layers are formed on the polycrystalline silicon layers. A source/drain region of the fin, which is not covered by the sidewall spacer layers, thereby forming a source/drain space. A source/drain epitaxial layer is formed in the source/drain space.

In accordance with another aspect of the present disclosure, a semiconductor device includes a plurality of fins on a substrate, a fin end spacer plug on an end surface of each of the plurality of fins and a fin liner layer, an insulating layer on the plurality of fins, and a source/drain epitaxial layer in a source/drain recess in each of the plurality of fins.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin and a second fin, both extending in a first direction;
    a fin end spacer extending in a second direction crossing the first direction and disposed between ends of the first and second fins;
    gate electrodes disposed over the first and second fins, respectively; and
    a dummy gate electrode over the fin end spacer,
    wherein a width of the fin end spacer is greater than a width of the dummy gate electrode, wherein a space between the ends of the first fin and the second fin is greater than the width of the dummy gate electrode and smaller than the width of the fin end spacer, and wherein the dummy gate electrode does not overlap the first fin and the second fin.

2. The semiconductor device of claim 1, wherein the fin end spacer has a two-layer structure made of different materials from each other.

3. The semiconductor device of claim 2, wherein an upper layer of the two-layer structure is made of silicon nitride.

4. The semiconductor device of claim 2, wherein a bottom layer of the two-layer structure comprises an insulating material layer.

5. The semiconductor device of claim 2, wherein each of the first fin and the second fin has a fin liner layer.

6. The semiconductor device of claim 5, wherein an upper layer of the two-layer structure has a bottom level below a top surface of the fin liner layer.

7. The semiconductor device of claim 5, wherein an upper layer of the two-layer structure has a bottom level above a top surface of the fin liner layer.

8. A semiconductor device, comprising:
    a first fin and a second fin, both extending in a first direction;
    a fin end spacer plug extending in a second direction crossing the first direction and disposed between ends of the first and second fins;
    gate electrodes disposed over the first fin and the second fin, respectively; and
    a dummy gate electrode over the fin end spacer plug, wherein the dummy gate electrode horizontally offsets from the first fin and the second fin.

9. The semiconductor device of claim 8, further comprising an insulating material layer disposed under the fin end spacer plug and extending in the first direction, wherein the fin end spacer plug and the insulating material layer separate the first fin and the second fin in the first direction.

10. The semiconductor device of claim 8, wherein the fin end spacer plug comprises a shallow fin end spacer plug.

11. The semiconductor device of claim 8, wherein the fin end spacer plug comprises a deep fin end spacer plug.

12. The semiconductor device of claim 8, wherein each of the first fin and the second fin has a fin liner layer.

13. The semiconductor device of claim 12, wherein the fin end spacer plug has a bottom level below a top surface of the fin liner layer.

14. The semiconductor device of claim 12, wherein the fin end spacer plug has a bottom level above a top surface of the fin liner layer.

15. A semiconductor device, comprising:
    a first fin and a second fin, both extending in a first direction;
    a fin end spacer plug extending in a second direction crossing the first direction and disposed between ends of the first fin and the second fin, wherein the fin end spacer plug has a two-layer structure made of different materials from each other;
    gate electrodes disposed over the first fin and the second fin, respectively; and
    a dummy gate electrode over the fin end spacer plug.

16. The semiconductor device of claim 15, wherein an upper layer of the two-layer structure is made of a material including silicon nitride based material.

17. The semiconductor device of claim 15, wherein the dummy gate electrode does not overlap the first and second fins.

18. The semiconductor device of claim 15, wherein each of the first fin and the second fin has a fin liner layer.

19. The semiconductor device of claim 18, wherein the fin end spacer plug has a bottom level below a top surface of the fin liner layer.

20. The semiconductor device of claim 18, wherein the fin end spacer plug has a bottom level above a top surface of the fin liner layer.

\* \* \* \* \*